US012724196B2

(12) United States Patent
Liao et al.

(10) Patent No.: US 12,724,196 B2
(45) Date of Patent: Sep. 1, 2026

(54) PHOTONIC SILICON-INSULATOR-SILICON MODULATOR AND METHODS FOR FORMING THE SAME

(71) Applicant: Taiwan Semiconductor Manufacturing Company Limited, Hsinchu (TW)

(72) Inventors: Chun-Heng Liao, Xindian City (TW); Jiun Yi Wu, Zhongli City (TW); Kuo-Chung Yee, Taoyuan City (TW); Li-Weng Chang, Sanxia Township (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 594 days.

(21) Appl. No.: 18/302,020

(22) Filed: Apr. 18, 2023

(65) Prior Publication Data

US 2024/0219634 A1 Jul. 4, 2024

Related U.S. Application Data

(60) Provisional application No. 63/436,118, filed on Dec. 30, 2022.

(51) Int. Cl.
*G02B 6/122* (2006.01)
*G02B 6/12* (2006.01)
(Continued)

(52) U.S. Cl.
CPC ........... *G02B 6/1223* (2013.01); *G02B 6/136* (2013.01); *G02F 1/025* (2013.01); *H10W 20/056* (2026.01);
(Continued)

(58) Field of Classification Search
CPC .................. G02B 6/1223; G02B 6/136; G02B 2006/12061; G02B 2006/12142; G02F 1/025; H10W 20/056; H10W 20/42
See application file for complete search history.

(56) References Cited

U.S. PATENT DOCUMENTS 8,274,039 B2 9/2012 Wober et al.
8,811,830 B2 * 8/2014 Yoneda .............. G02B 6/12004
398/164

(Continued)

FOREIGN PATENT DOCUMENTS

CN 107408589 A 11/2017
CN 210803771 U 6/2020

(Continued)

OTHER PUBLICATIONS

TW Patent and Trademark Office; TW Application No. 112122382; Office Action mailed Nov. 19, 2024; 18 pages.

*Primary Examiner* — John Bedtelyon
(74) *Attorney, Agent, or Firm* — The Marbury Law Group, PLLC

(57) ABSTRACT

An embodiment photonic device may include a first terminal including silicon and a waveguide structure optically connected with the first terminal, a cladding dielectric layer formed around the first terminal including the waveguide structure, a second terminal including polysilicon, and a capacitor dielectric layer disposed between the first terminal and the second terminal. The capacitor dielectric layer may include a SiON layer. The waveguide structure may include a first index of refraction in response to an application of a first voltage difference between the first terminal and the second terminal and a second index of refraction in response to an application of a second voltage difference between the first terminal and the second terminal. The silicon of the first
(Continued)

1900 terminal may include a p-typed doping and the polysilicon of the second terminal may include an n-type doping.

20 Claims, 35 Drawing Sheets

(51) Int. Cl.

| | |
|---|---|
| ***G02B 6/136*** | (2006.01) |
| ***G02F 1/025*** | (2006.01) |
| ***H10W 20/00*** | (2026.01) |
| ***H10W 20/42*** | (2026.01) |

(52) U.S. Cl.
CPC ... *H10W 20/42* (2026.01); *G02B 2006/12061* (2013.01); *G02B 2006/12142* (2013.01)

(56) References Cited

U.S. PATENT DOCUMENTS

| | | | | |
|---|---|---|---|---|
| 10,133,098 | B2 * | 11/2018 | Chen | H10D 64/68 |
| 2005/0189591 | A1 * | 9/2005 | Gothoskar | G02B 6/12004 257/347 |

FOREIGN PATENT DOCUMENTS

| | | | |
|---|---|---|---|
| CN | 115039003 | A | 9/2022 |
| TW | 202242465 | A | 11/2022 |
| TW | 202246822 | A | 12/2022 |

* cited by examiner 300b
212
218a
306
306
210
302a
218b
302b
304
308

300a
212
218a
306
210
306
302a
218b
302b
304
308

1100
1102
1104a
606
406
616
508
501
1104b
1104c
1104d
510a
510b
510c
506
504
502
408

1700

2500

PHOTONIC SILICON-INSULATOR-SILICON MODULATOR AND METHODS FOR FORMING THE SAME

RELATED APPLICATIONS

This application claims priority from U.S. Provisional Application Ser. No. 63/436,118 entitled "Photonic Silicon-Insulator-Silicon Modulator and Methods For Forming The Same," filed on Dec. 30, 2022, the entire contents of which are incorporated herein by reference for all purposes.

BACKGROUND

Many computing applications use optical signals for secure high-speed data transmission. Various emerging technologies are also being developed that may provide functionality to perform computing operations directly on optical signals. Silicon photonics is a promising technology area that uses semiconductor device processing techniques to provide systems including integrated electronic and photonic components. Such components may be used for the generation, routing, modulation, processing, and detection of light. Together, these functions form an optical analog to electronic integrated circuits (IC) and, as such, may constitute photonic integrated circuits (PIC).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
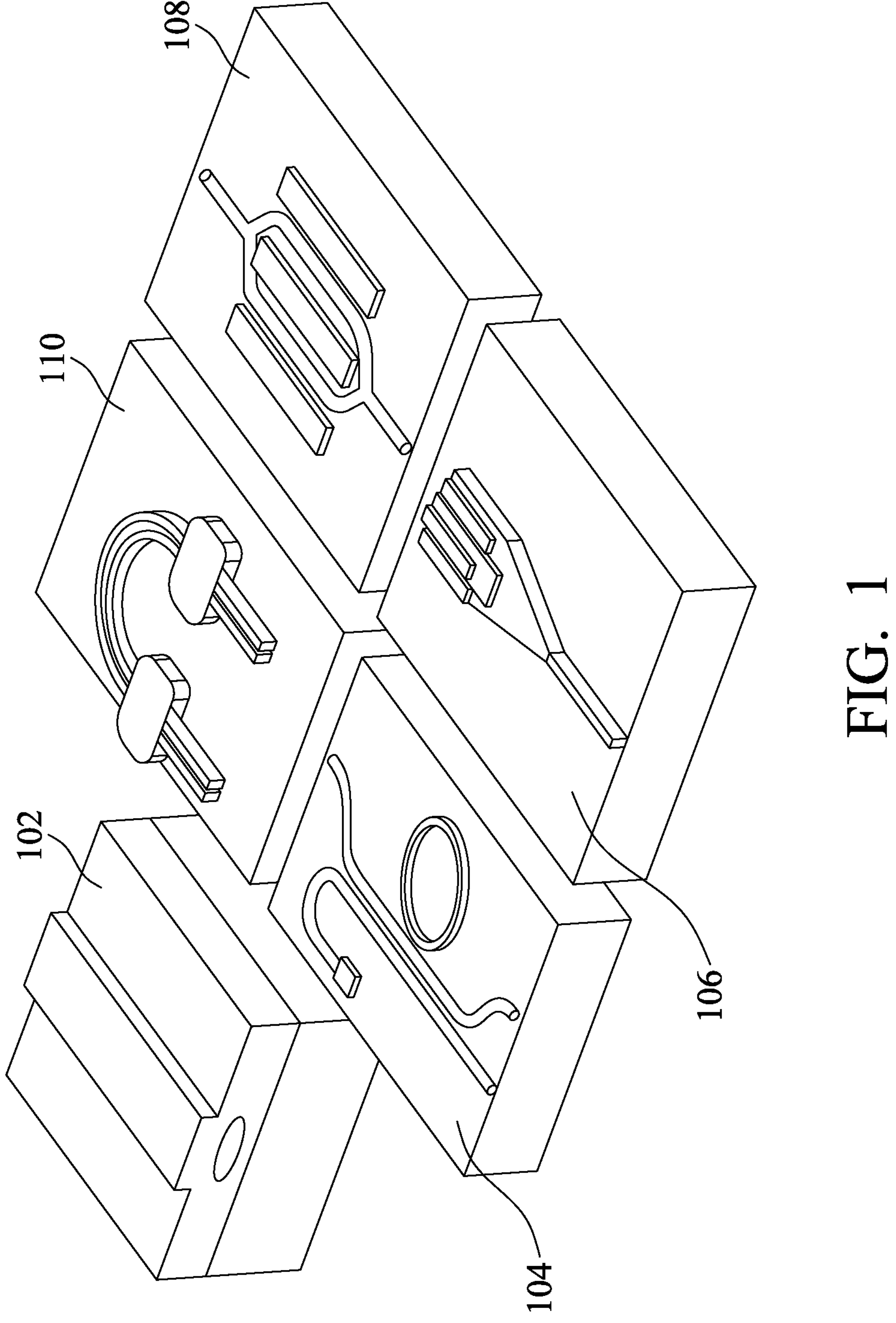
FIG. 1 is a schematic illustration of various components that may be used in a photonic computing system.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Optical phase and amplitude modulators play an important role in photonic computing systems. An electro-optic modulator is a device that has optical properties (e.g., index of refraction and absorption coefficient) that may be varied as a function of an applied electrical potential. Such electro-optic modulators may be used to convert an electrical signal, applied to the modulator, into an optical signal in which data may be encoded based on the time dependent modulations of the optical signal. Various embodiments disclosed herein may provide advantages over existing modulators by generating larger optical phase shifts for a given applied voltage. Further, various embodiments disclosed herein may provide reduced optical insertion loss relative to existing modulators.

An embodiment photonic device may include a first terminal including silicon and a waveguide structure optically connected with the first terminal, a cladding dielectric layer formed around the first terminal including the waveguide structure, a second terminal including polysilicon, and a capacitor dielectric layer disposed between the first terminal and the second terminal. The capacitor dielectric layer may include a SiON layer. The waveguide structure may include a first index of refraction in response to an application of a first voltage difference between the first terminal and the second terminal and a second index of refraction in response to an application of a second voltage difference between the first terminal and the second terminal. The silicon of the first terminal may include a p-typed doping and the polysilicon of the second terminal may include an n-type doping. Various embodiment photonic devices (e.g., modulators) may have advantages over p-n junction modulators by providing larger phase variations with a given applied voltage. Various embodiment photonic modulators may exhibit lower optical insertion loss.

An embodiment method of fabricating a photonic device may include etching a silicon-on-insulator substrate to form a first terminal comprising silicon and a waveguide structure connected with the first terminal, forming a cladding dielectric layer around the first terminal and the waveguide structure, forming a capacitor dielectric layer over the first terminal that has a thickness in a range from approximately 1.5 nm to 4.5 nm and a dielectric constant that is in a range from approximately 5.0 to 6.8, forming a second terminal comprising polysilicon over the capacitor dielectric layer, and doping the first terminal with a p-type dopant and doping the second terminal with an n-type dopant.

A further embodiment method of fabricating a photonic device may include etching a silicon-on-insulator substrate to form a first terminal comprising silicon and a waveguide structure connected with the first terminal, forming a cladding dielectric layer around the first terminal and the waveguide structure, forming a capacitor dielectric layer over the first terminal, forming a polysilicon layer over the capacitor dielectric layer, and etching the polysilicon layer and the capacitor dielectric layer to form a second terminal comprising polysilicon and an insulator comprising a portion of the capacitor dielectric layer disposed between the first terminal and the second terminal.

FIG. 1 is an illustration of various components that may be used in a photonic computing system. System components may include a generation unit also referred to as a photonic source 102 such as a laser or light-emitting diode (LED), a routing unit that may include a plurality of waveguides 104 configured to route optical signals, and a detector that includes one or more optical detectors 106 configured to detect optical signals and to convert received optical signals into output electrical signals. Additional components may include a modulation unit that includes one or more optical modulators 108 and photonic processing components 110. The one or more optical modulators 108 may be configured to impose an amplitude and/or frequency modulation on an input optical signal generated by photonic source 102. The photonic processing components 110 may be configured to perform logic operations on the modulated optical signal. The one or more optical modulators 108 may take an input electronic signal and modulate the input optical signal to impose the amplitude and/or frequency modulation in response to the input electronic signal. In this way, the one or more optical modulators 108 may be used to convert data provided in the form of an electronic signal into data encoded as a photonic signal. Similarly, the one or more optical detectors 106 may convert processed photonic signals back into output electrical signals.

Figure 2A:
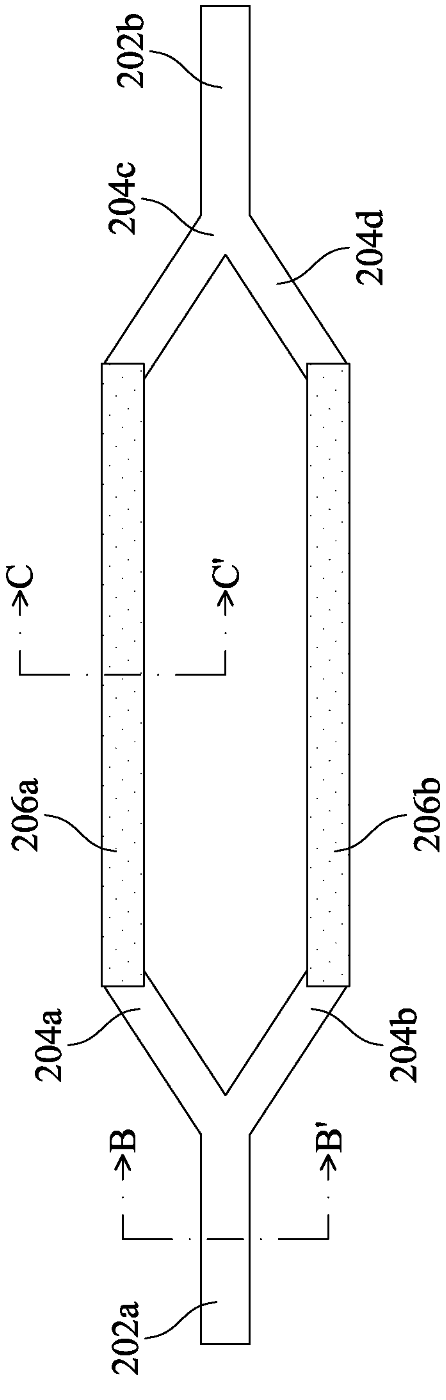
FIG. 2A is a top view of an electro-optic modulator that may be used in a photonic computing system.

FIG. 2A is a top view of an electro-optic modulator 200*a* that may be used in a photonic computing system. The cross-section B-B' indicates a vertical plane defining the cross-sectional view shown in FIG. 2B and the cross-section C-C' indicates a vertical plane defining the cross-sectional view of FIG. 2C. The electro-optic modulator 200*a* may include a first waveguide segment 202*a* and a second waveguide segment 202*b*. The first waveguide segment 202*a* may be configured to receive an input optical signal and the second waveguide segment 202*b* may be configured to provide a modulated optical signal as output. As shown, the first waveguide segment 202*a* may branch into a first waveguide segment 204*a* and a second waveguide segment 204*b*. As such, the first waveguide segment 202*a*, the first waveguide segment 204*a*, and the second waveguide segment 204*b* may act as a beam splitter.

An input signal received by the first waveguide segment 202*a* may be split into two optical signals that may be carried by the first waveguide segment 204*a* and the second waveguide segment 204*b*, respectively. A first optical signal carried by the first waveguide segment 202*a* may be provided to a first modulator portion 206*a* and a second optical signal carried by the second waveguide segment 202*b* may be provided to a second modulator portion 206*b*. The first modulator portion 206*a* and the second modulator portion 206*b* may modify an amplitude and/or a phase of the respective first optical signal and the second optical signal.

The modified first optical signal transmitted along a third waveguide segment 204*c* and the modified second optical signal transmitted along a fourth waveguide segment 204*d* may then be combined to form an output optical signal that is provided to the second waveguide segment 202*b*. In this regard, the third waveguide segment 204*c* may be optically coupled to the first modulator portion 206*a* and the fourth waveguide segment 204*d* may be optically coupled to the second modulator portion 206*b*. In turn, the third waveguide segment 204*c* and the fourth waveguide segment 204*d* may be optically coupled to the second waveguide segment 202*b*. As such, the third waveguide segment 204*c*, the fourth waveguide segment 204*d*, and the second waveguide segment 202*b* may act as a beam combiner. The first modulator portion 206*a* and the second modulator portion 206*b* may each modulate the respective first optical signal and the second optical signal according to an electro-optic effect. In this regard, the first modulator portion 206*a* and the second modulator portion 206*b* may each include a material having electro-optic properties. Such an electro-optic material may have optical properties (e.g., index of refraction and absorption coefficient) that may vary as a function of an applied electrical bias.

Figures 2B, 2C:
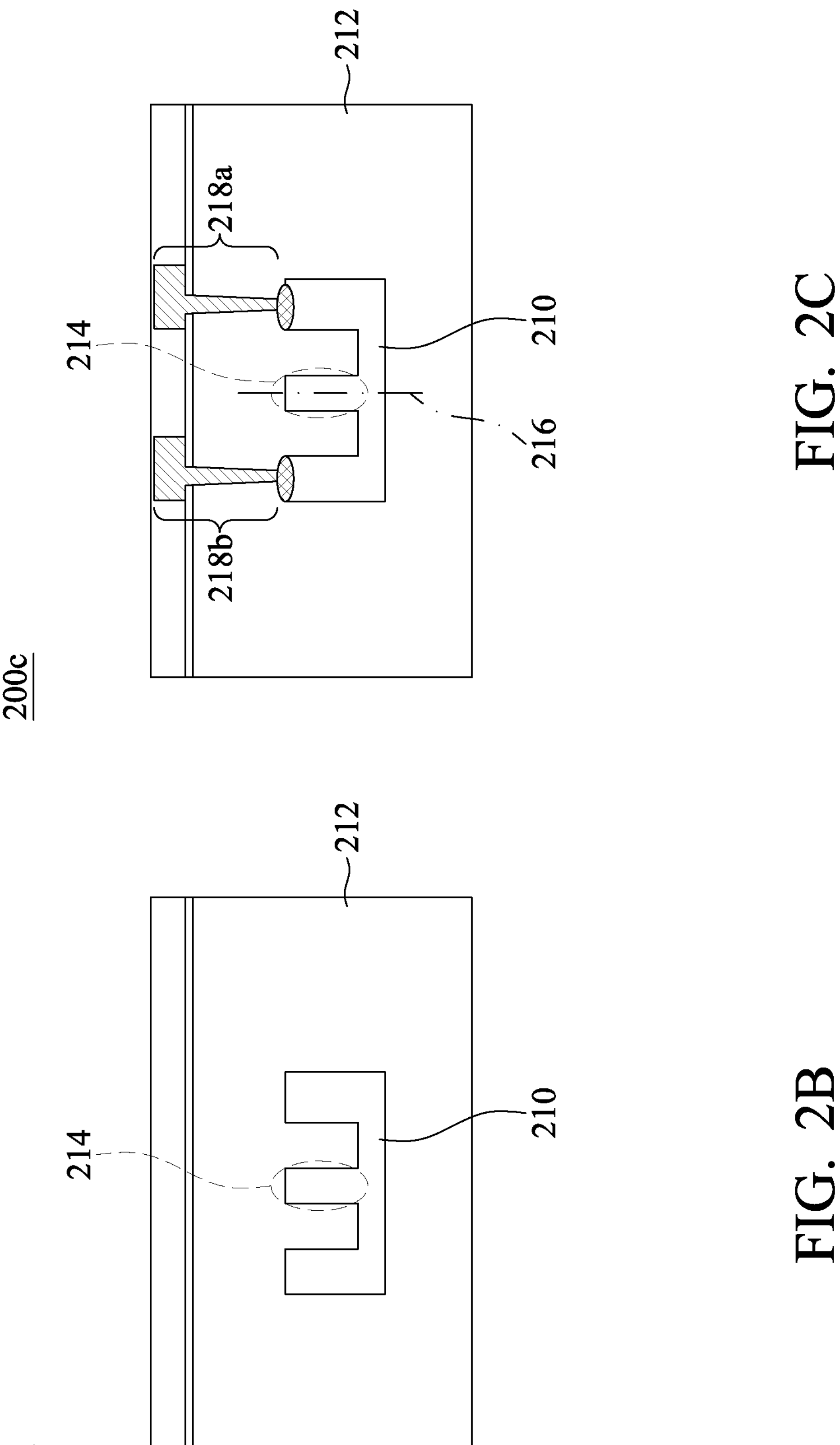
FIG. 2B is a vertical cross-sectional view of a silicon waveguide.
FIG. 2C is a vertical cross-sectional view of an electro-optic modulator having a p-n junction.

FIG. 2B is a vertical cross-sectional view of a silicon waveguide 200*b*. As mentioned above, the vertical plane defining the view illustrated in FIG. 2B is indicated by the cross-section B-B' in FIG. 2A. The silicon waveguide 200*b* may include a core portion 210 and a cladding portion 212. The core portion 210 and the cladding portion 212 may each be configured to be transparent to light of a particular wavelength (e.g., infrared radiation). The core portion 210 and the cladding portion 212 may be formed using semiconductor device fabrication processes, as described in greater detail below.

The core portion 210 may be configured to have a higher index of refraction than that of the cladding portion 212. For example, the core portion 210 may be formed of doped or undoped silicon (e.g., index of refraction 3.88) and the cladding portion 212 may be formed of silicon oxide (e.g., index of refraction 1.46). Light may preferentially propagate in the core portion 210 due to the phenomena of total internal reflection resulting from the higher index of refraction of the core portion 210 relative to the cladding portion 212. For example, an optical mode may propagate within the core portion 210 and may have an electric field distribution that is confined to a central region 214 of the core portion. The specific shape of the core portion 210 shown in FIG. 2B is merely an example and the core portion 210 may have various other shapes in other application.

FIG. 2C is a vertical cross-sectional view of an electro-optic modulator 200*c* having a p-n junction. As mentioned above, the vertical plane defining the view illustrated in FIG. 2C is indicated by the cross-section C-C' in FIG. 2A. The electro-optic modulator 200*c* may include a core portion 210 and a cladding portion 212 similar to the structures of the silicon waveguide 200*b* described above with reference to FIG. 2B. As such, an optical mode may propagate within the core portion 210 and may have an electric field distribution that is confined to a central region 214 of the core portion. In contrast to the silicon waveguide 200*b* of FIG. 2B, however, the core portion 210 of the electro-optic modulator 200*c* may have a doping profile that may exhibit an electro-optic effect. For example, the central region 214 of the electro-optic modulator 200*c* may be doped to form a p-n junction. For example, the central region 214 may include p-type dopants on a first side (e.g., to the left of the dashed line 216) and may include n-type dopants on a second (e.g., to the right of the dashed line 216) of the central region 214.

The electro-optic modulator 200*c* may further include a first electrode 218*a* and a second electrode 218*b*. An applied potential difference (i.e., a voltage difference or bias) between the first electrode 218*a* and the second electrode 218*b* may alter a distribution of electrical charge carriers within the central region 214. According to the free carrier dispersion effect in silicon, the optical properties of the central region 214 may be changed by altering the carrier distribution by an applied bias. For example, in forward bias, carriers may be injected into the p-n junction reducing a size of the depletion region. In reverse bias, carriers may be depleted thereby increasing the size of the depletion region. In one configuration, the electro-optic modulator 200*c* may be operated in reverse bias (i.e., depletion mode) to have a low concentration of free carriers such that the central region 214 exhibits relatively low optical absorption.

Figures 3A, 3B:
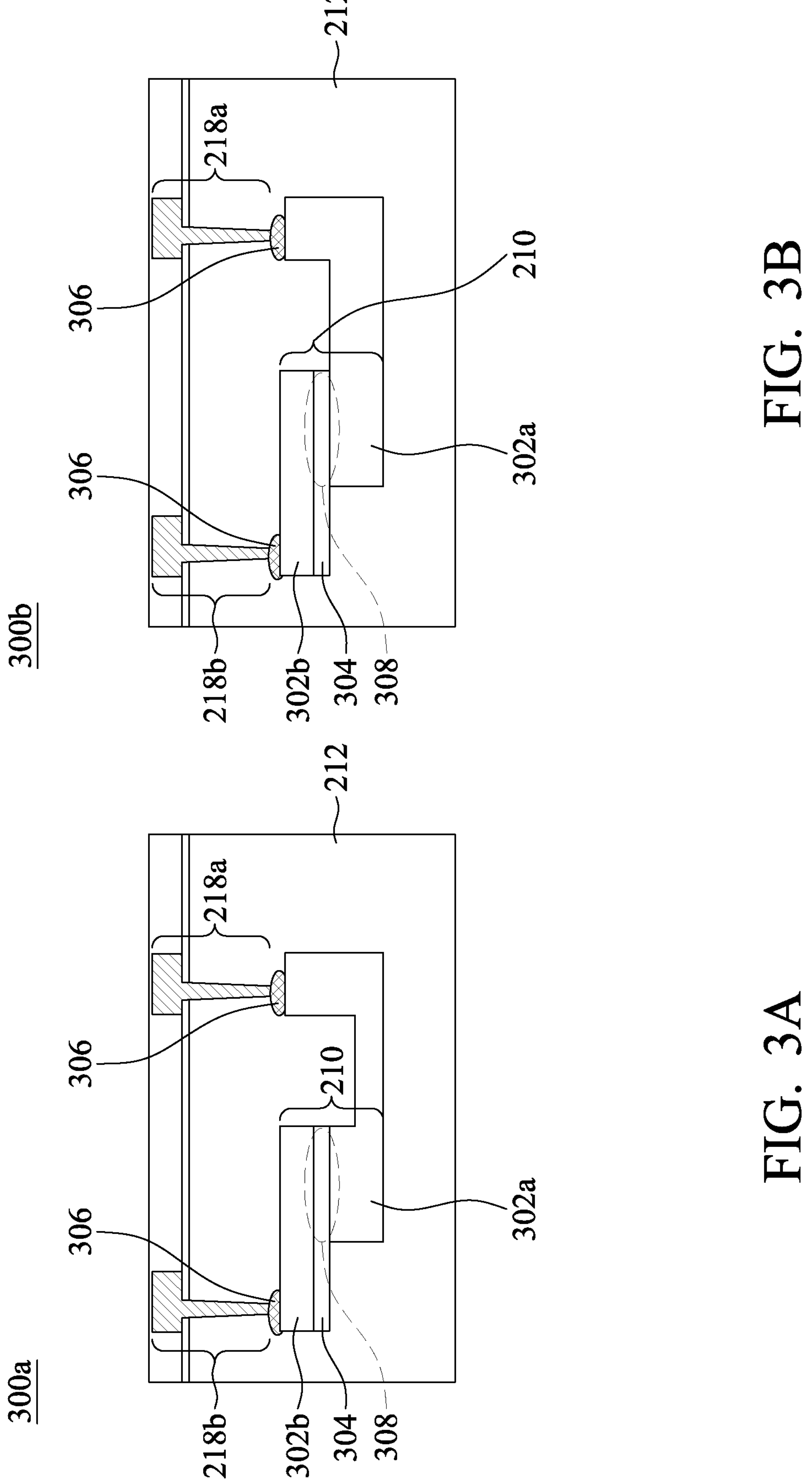
FIG. 3A is a vertical cross-sectional view of a semiconductor-insulator-capacitor modulator, according to various embodiments.
FIG. 3B is a vertical cross-sectional view of a further semiconductor-insulator-capacitor modulator, according to various embodiments.

FIG. 3A is a vertical cross-sectional view of a first semiconductor-insulator-capacitor (SISCAP) modulator 300*a*, and FIG. 3B is a vertical cross-sectional view of a second SISCAP modulator 300*b*, according to various embodiments. Each of the first SISCAP modulator 300*a* and the second SISCAP modulator 300*b* may include a core portion 210, a cladding portion 212, a first electrode 218*a*, and a second electrode 218*b*. In contrast to the electro-optic modulator 200*c* of FIG. 2C, however, the core portion 210 of the first SISCAP modulator 300*a* and the second SISCAP modulator 300*b* may be formed as a capacitor structure.

The capacitor structure may include a first semiconductor structure 302*a* and a second semiconductor structure 302*b* that may be separated by an insulator 304. For example, the first semiconductor structure 302*a* may include doped silicon, the second semiconductor structure 302*b* may include doped polysilicon, and the insulator may include a suitable oxide such as silicon oxynitride, etc. As such, the first semiconductor structure 302*a* may form a first terminal of the SISCAP modulator (300*a*, 300*b*), the second semiconductor structure 302*b* may form a second terminal of the SISCAP modulator (300*a*, 300*b*), and the insulator 304 may form the capacitor dielectric. The first semiconductor structure 302*a* (i.e., the first terminal) may be electrically coupled to the first electrode 218*a* and the second terminal may be electrically coupled to the second electrode 218*b*. In this regard, metallic materials of the first electrode 218*a* and the second electrode 218*b* may be electrically coupled to the first semiconductor structure 302*a* and the second semiconductor structure 302*b*, respectively, by the formation of a salicide material portions 306 (i.e., metal/silicon compounds) that electrically connect respective metallic and semiconductor materials.

The core portion 210 in each of the first SISCAP modulator 300*a* and the second SISCAP modulator 300*b* may form an optical waveguide in which an electric field distribution of the propagating optical wave may be confined to a waveguide structure 308 between the first terminal (i.e., the first semiconductor structure 302*a*), the second terminal (i.e., the second semiconductor structure 302*b*), and the insulator 304. As with the electro-optic modulator 200*c* of FIG. 2C, application of a voltage difference between the first terminal 302*a* (e.g., as applied to the first electrode 218*a*) and the second terminal 302*b* (e.g., as applied to the second electrode 218*b*) may act to change optical properties of the optical waveguide by changing a free carrier concentration of charges within the material of the SISCAP modulators (300*a*, 300*b*). In general, the amount of charge that may be stored in a capacitor is proportional to the capacitance, which in turn, is proportional to the dielectric constant of the insulator 304 and inversely proportional to the thickness of the insulator 304. Thus, for a given applied voltage, the amount of charge that may be stored on the capacitor is proportional the dielectric constant and inversely proportional the thickness of the insulator 304. As such, to increase the electro-optic effect, and thus increase the efficiency of the modulator, it may be advantageous to increase the capacitance of the SISCAP modulators (300*a*, 300*b*) by using a thin insulator 304 having a high dielectric constant.

The first SISCAP modulator 300*a* and the second SISCAP modulator 300*b* may have advantages over the electro-optic modulator 200*c* of FIG. 2C. In this regard, disclosed embodiments are based on a process of generating a thin SiON insulator 304 having a high dielectric constant, as describe in greater detail with reference to FIGS. 19A to 19E, below. As such, the first SISCAP modulator 300*a* and the second SISCAP modulator 300*b* may exhibit significantly increased capacitance, and correspondingly increased electro-optic properties, in contrast to p-n junction modulators, such as those described above with reference to FIG. 2C. Thus, a larger change in the optical properties of the core portion 210 may be induced for a given applied potential difference. In this regard, an applied voltage required to induce a 180 degree phase shift may be less than approximately 0.4 volts in contrast to existing modulators that typically require approximately 2 volts. The first SISCAP modulator 300*a* and the second SISCAP modulator 300*b* may also exhibit reduced optical insertion loss (<0.18 dB) relative to the electro-optic modulator 200*c* (<0.65) of FIG. 2C due to the relatively lower concentration of free carriers in the insulator 304 where a significant fraction of the electric field distribution of the propagating optical mode resides.

Figure 19A:
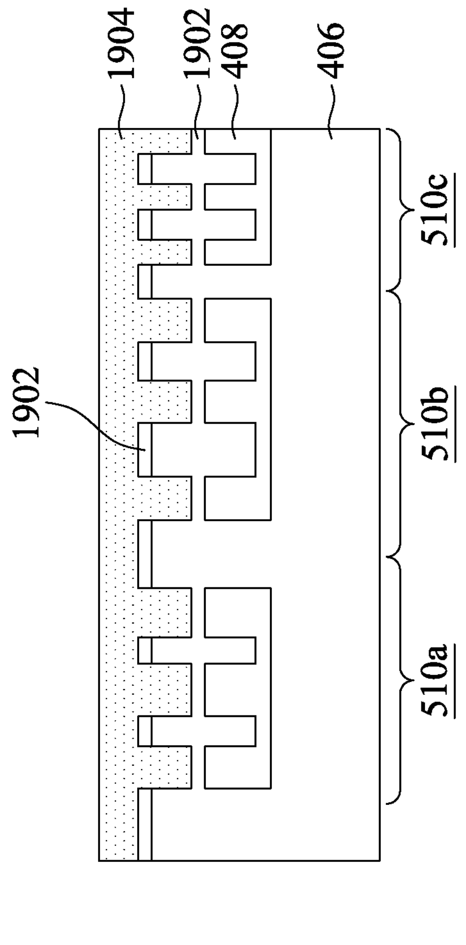
FIG. 19A is a vertical cross-sectional view of a further intermediate structure that may be used to form one or more photonic devices, according to various embodiments.
Figure 19A:
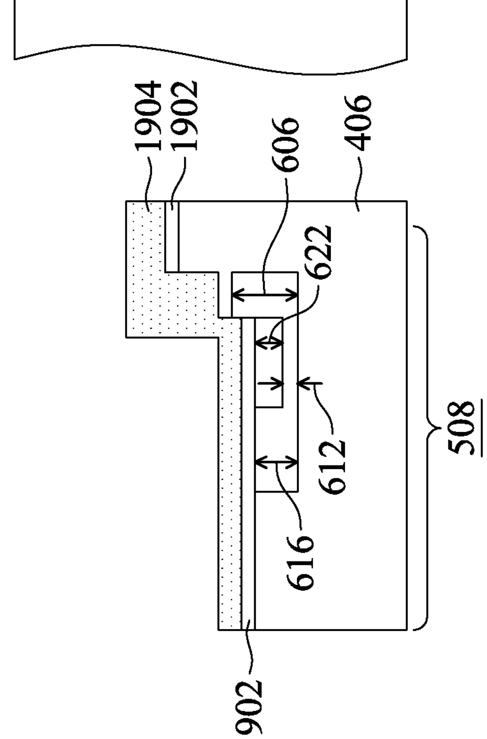
Figures 19B, 19C, 19D, 19E:
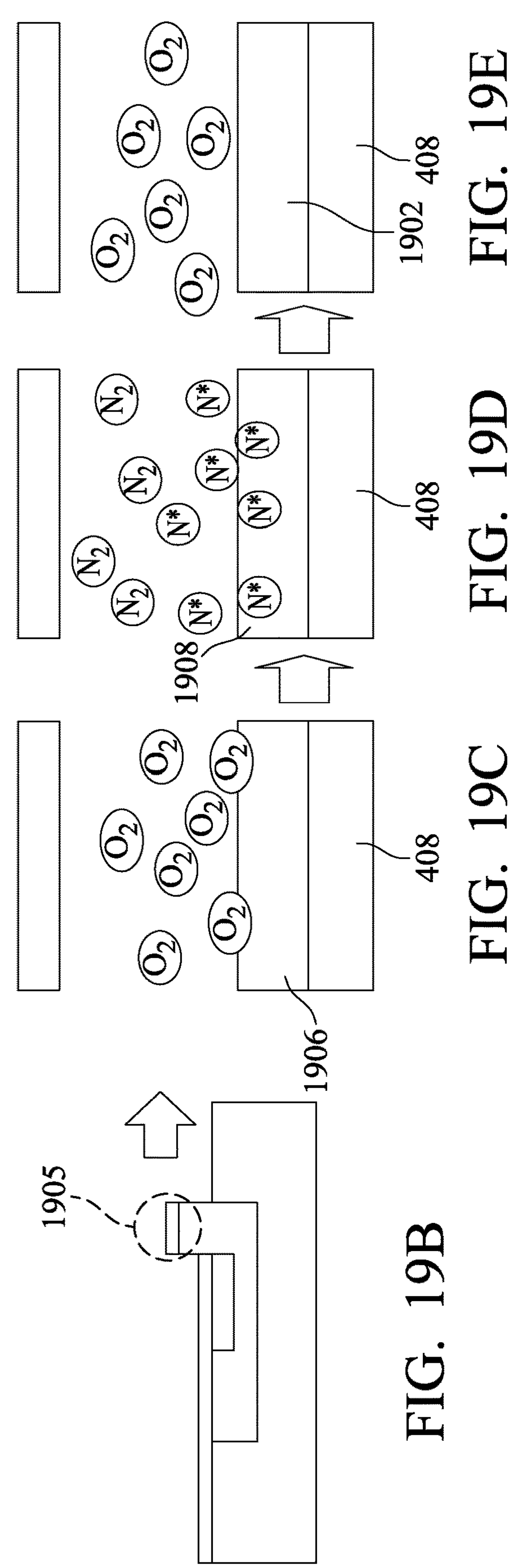
FIG. 19B is a vertical cross-sectional view of a portion of the structure of FIG. 19A showing details of an oxide formation process, according to various embodiments.
FIG. 19C is a vertical cross-sectional view of a portion of the structure of FIG. 19B showing details of an oxide formation process, according to various embodiments.
FIG. 19D is a vertical cross-sectional view of a portion of the structure of FIG. 19B showing further details of an oxide formation process, according to various embodiments.
FIG. 19E is a vertical cross-sectional view of a portion of the structure of FIG. 19B showing further details of an oxide formation process, according to various embodiments.

According to an example embodiment, first terminal 302*a* may include p-doped silicon (e.g., see FIG. 23), the second terminal 302*b* may include n-doped polysilicon (e.g., see FIG. 23), and the insulator 304 may include silicon oxynitride (e.g., see FIG. 19E). Each of the first terminal 302*a*, the second terminal 302*b*, and the insulator 304 may include a length along an optical propagation direction (i.e., into the plane of the figure) that is in a range from approximately 150 microns to approximately 300 microns. The length of the modulator may depend on the strength of the electro-optic properties of the modulator. For example, a first modulator having a stronger electro-optic effect may have a shorter length than a second modulator having a weaker electro-optic effect. Thus, while the embodiment SISCAP modulators (300*a*, 300*b*) may have a length from 150 microns to 300 microns, a corresponding p-n junction modulator 200*c* may require a longer length, such as between 1000 microns and 3000 microns. Thus, the embodiment SISCAP modulators (300*a*, 300*b*) may have a length that is approximately a factor of 10 smaller than a corresponding p-n junction modulator 200*c*.

The first terminal 302*a* may have a thickness in a range from approximately 125 nm to approximately 180 nm, and the second terminal 302*b* may have a thickness in a range from approximately 85 nm to approximately 140 nm. For example, the first terminal may include a thickness that is approximately 130 nm or 175 nm, and the second terminal may include a thickness that is approximately 90 nm or 135 nm. The insulator may include a thickness in a range from approximately 1.5 nm to 4.5 nm. In other embodiments, the insulator 304 may include a thickness that is approximately 2 nm. These thickness ranges may represent an optimal range of thicknesses in the sense that it may be desirable to have an insulator 304 that is as small as possible to have a capacitance that is as large as possible. However, in instances in which the insulator thickness is too small, the device may exhibit electrical leakage currents through the insulator. Further, to reduce an overall device size, it may be desirable to make the first terminal 302*a* and the second terminal 302*b* as small as possible. However, it may be desirable to form the first terminal 302*a* and the second terminal 30*b* to be sufficiently large enough to generate a charge distribution sufficient to produce the desired change in optical properties (e.g., index of refraction).

The above-described thicknesses may represent an improvement over p-n junction modulators 200*c*. In this regard, a corresponding p-n junction modulator 200*c* may require a greater thickness, for example, 270 nm to achieve a comparable electro-optic effect. As described above, using a thin insulator 304 having a large dielectric constant allows the embodiment SISCAP modulators (300*a*, 300*b*) to be smaller than corresponding components of the corresponding p-n junction modulator 200*c*. In various embodiments, the first terminal 302*a*, the second terminal 302*b*, and the insulator 304 may include a width that is in a range from approximately 0.4 microns to approximately 0.6 microns. For example, the first terminal 302*a*, the second terminal 302*b*, and the insulator 304 may include a width that is approximately 0.5 microns. These widths may be somewhat wider than that that of a corresponding p-n junction modulator 200*c* which may have a width that is approximately 0.37 microns. The increased widths of the embodiment SISCAP modulators (300*a*, 300*b*) may result in a corresponding increased capacitance, which as described above, leads to improved performance of the SISCAP modulators (300*a*, 300*b*). In some embodiments, the capacitance per unit area may be approximately 10 to 12 fF/micron$^2$.

Figure 4:
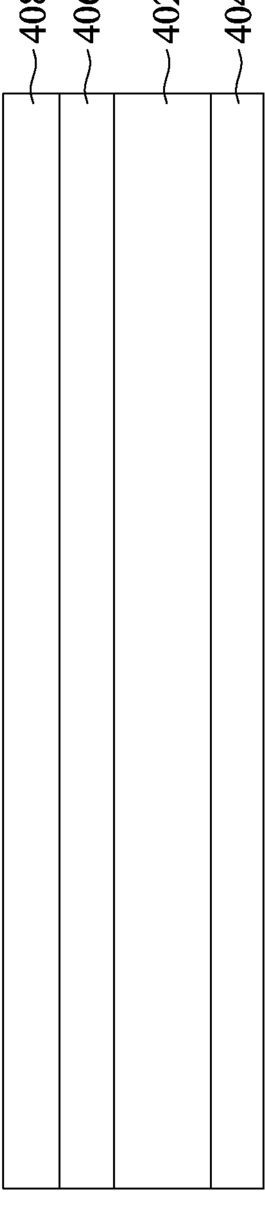
FIG. 4 is a vertical cross-sectional view of an intermediate structure that may be used to form one or more photonic devices, according to various embodiments.

FIG. 4 is a vertical cross-sectional view of an intermediate structure 400 that may be used in the formation of one or more photonic devices, according to various embodiments. In an example embodiment, the intermediate structure 400 may be a silicon-on-insulator (SOI) substrate. In this regard, the intermediate structure 400 may include a bulk silicon layer 402 having a backside silicon oxide layer 404. The intermediate structure 400 may further include a buried oxide layer 406 sandwiched between the bulk silicon layer 402 and a top silicon layer 408. In some embodiments, the backside oxide layer may have a thickness in a range from approximately 2.0 microns to approximately 3.0 microns (e.g., 2.5 microns), the buried oxide may have a thickness in a range from approximately 2.0 microns to approximately 3.0 microns (e.g., 2.5 microns), and the top silicon layer 408 may have a thickness of approximately 290 nm to approximately 310 nm (e.g., 305 nm). These thickness values are provided merely as examples and various other thicknesses may be used in other embodiments.

As described with reference to FIGS. 5 to 31, below, a plurality of different types of photonic devices may be formed on the same substrate (e.g., the SOI substrate of FIG. 4). The example photonic devices formed in processes involving the intermediate structures of FIGS. 4 to 31 include SISCAP modulators (300*a*, 300*b*), p-n junction modulators 200*c*, and waveguides 200*b*. The inclusion of p-n junction modulators 200*c* in FIGS. 4 to 31, however, is merely provided in various examples and such p-n junction modulators 200*c* do not play a role in any of the claimed embodiments.

Figure 5:
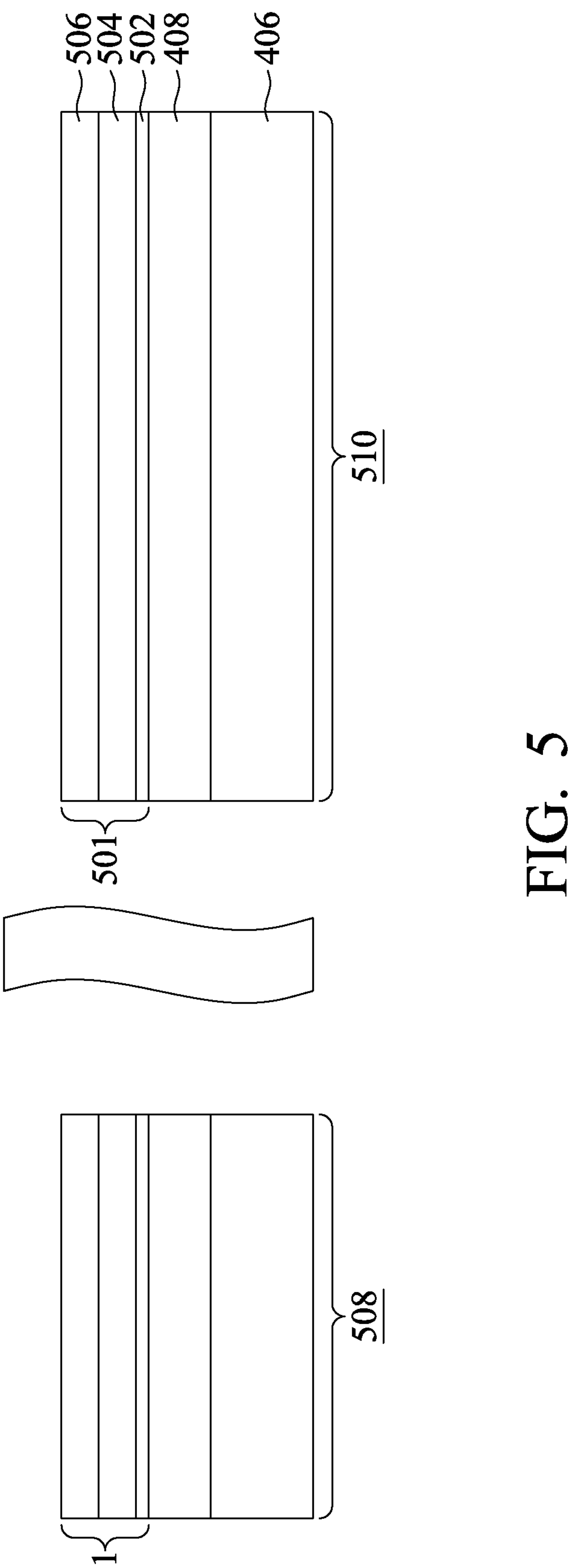
FIG. 5 is a vertical cross-sectional view of a further intermediate structure that may be used to form one or more photonic devices, according to various embodiments.

FIG. 5 is a vertical cross-sectional view of a further intermediate structure 500 that may be used to form one or more photonic devices, according to various embodiments. The intermediate structure 500 may be formed from the intermediate structure 400 of FIG. 4 by forming an additional multi-layer structure 501 over the top silicon layer 408. The additional multi-layer structure may include a pad oxide layer 502, a silicon nitride (SiN) layer 504, and a low-k dielectric layer 506, such as a layer of tetraethyl orthosilicate (TEOS). In some embodiments, the pad oxide layer 502 may have a thickness that is approximately 9 nm, the SiN layer 504 may have a thickness that is approximately 80 nm, and the low-k dielectric layer 506 may have a thickness that is approximately 90 nm. These thickness values are provided merely as examples and various other thicknesses may be used in other embodiments.

The intermediate structure 500 may include a first photonic device region 508 and a second spatially separated region 510 of the intermediate structure 400 of FIG. 4. The first photonic device region 508 may be used to form one or more of a first type of photonic device and the second region 510 may be used to form one or more of a second or third type of photonic device. For example, one or more SISCAP modulators (300*a*, 300*b*) may be formed in the first photonic device region 508, while in the second region 510 one or more silicon waveguides 200*b* and/or electro-optic modulators 200*c* may be formed.

Figure 6:
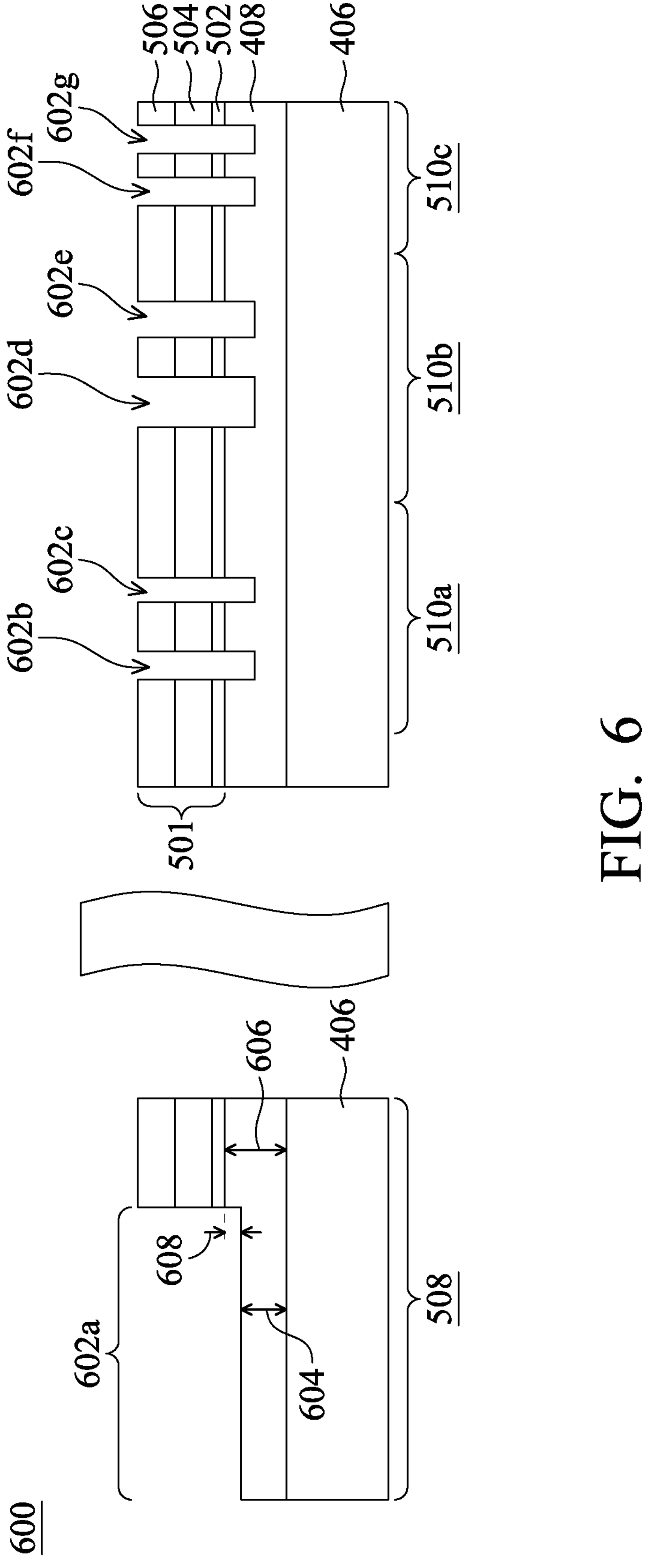
FIG. 6 is a vertical cross-sectional view of a further intermediate structure that may be used to form one or more photonic devices, according to various embodiments.

FIG. 6 is a vertical cross-sectional view of a further intermediate structure 600 that may be used to form one or more photonic devices, according to various embodiments. The intermediate structure 600 may be formed from the intermediate structure 500 of FIG. 5 by performing an etching process on the multi-layer structure 501 of FIG. 5. In this regard, an anisotropic etch process may be performed to generate a plurality of etched regions (602*a*, 602*b*, 602*c*, 602*d*, 602*e*, 602*f*, 602*g*). For example, a blanket layer of a photoresist (not shown) may be formed over the multi-layer structure 501 of FIG. 5. The photoresist may then be patterned using lithographic techniques to form a patterned photoresist over the multi-layer structure 501 of FIG. 5. The patterned photoresist may then be used as a mask during the etching process to etch the multilayer structure 501. The patterned photoresist may then be removed by ashing or by dissolution with a solvent.

As shown in FIG. 6, the etching process may be allowed to progress until the multi-layer structure 501 has been completely removed in each plurality of etched regions (602*a*, 602*b*, 602*c*, 602*d*, 602*e*, 602*f*, 602*g*) along with a portion of the top silicon layer 408. For example, a first thickness 604 of top silicon layer 408 in in each plurality of etched regions (602*a*, 602*b*, 602*c*, 602*d*, 602*e*, 602*f*, 602*g*) may have a value that is approximately 200 nm, while a second thickness 606 of the top silicon layer 408 in non-etched portions may be approximately 270 nm. As such, third thickness 608 characterizing an amount of silicon removed from the top silicon layer 408 may be approximately 70 nm. These thickness values are provided merely as examples and various other thicknesses may be used in other embodiments.

Each of the plurality of etched regions (602*a*, 602*b*, 602*c*, 602*d*, 602*e*, 602*f*, 602*g*) may correspond to various photonic devices that may be subsequently formed. For example, a first etched region 602*a* may reside to the first photonic device region 508 described above with reference to FIG. 5 in which a first photonic device may be formed. Similarly, a plurality of photonic devices may be formed in the second region 510 of FIG. 5. In this regard, the second etched region 602*b* and the third etched region 602*c* may correspond to a second photonic device region 510*a*, the fourth etched region 602*d* and the fifth etched region 602*e* may correspond to a third photonic device region 510*b*, and the sixth etched region 602*f* and the seventh etched region 602*g* may correspond to a fourth photonic device region 510*c*.

Figure 7:
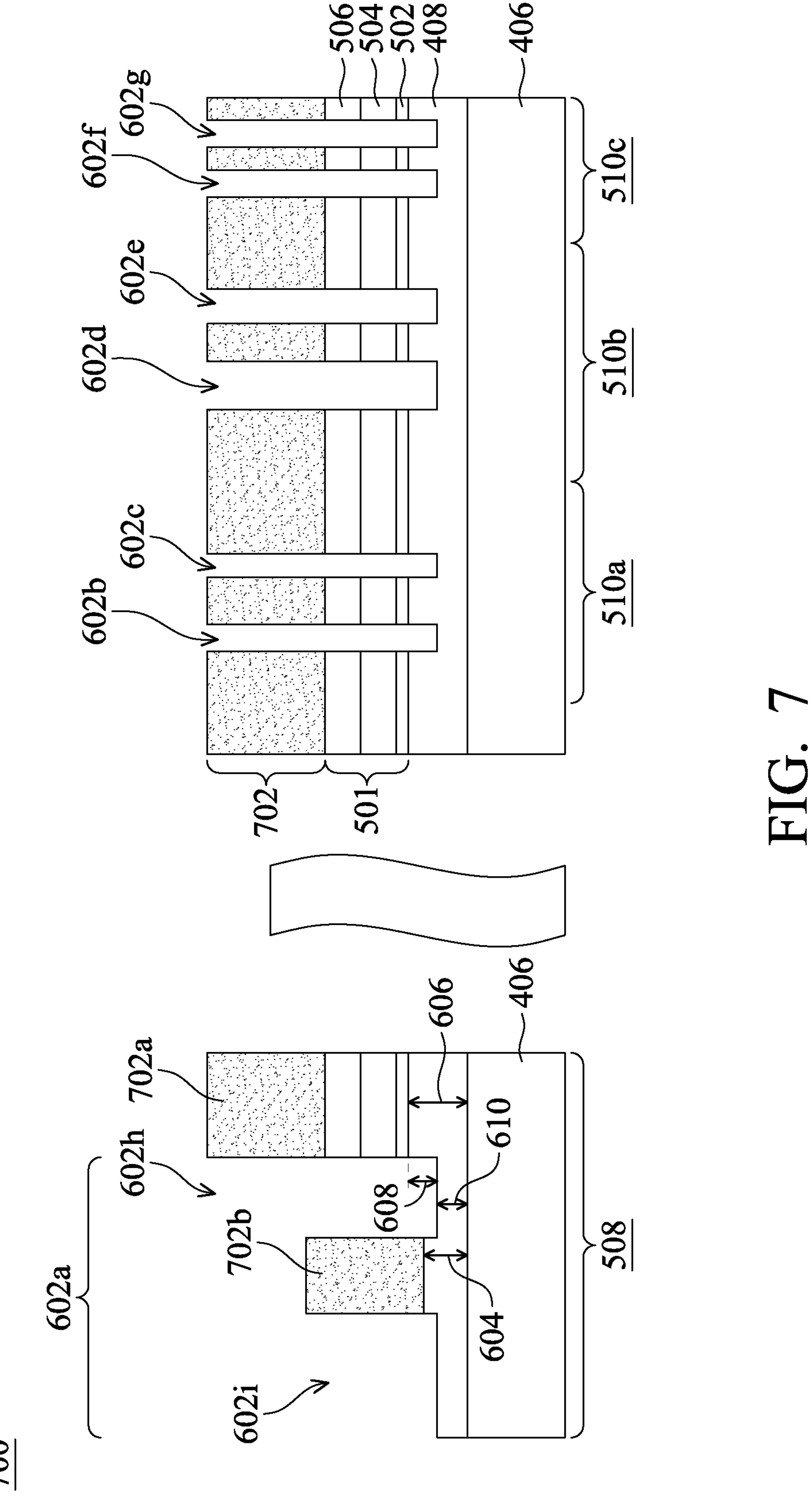
FIG. 7 is a vertical cross-sectional view of a further intermediate structure that may be used to form one or more photonic devices, according to various embodiments.

FIG. 7 is a vertical cross-sectional view of a further intermediate structure 700 that may be used to form one or more photonic devices, according to various embodiments. The intermediate structure 700 of FIG. 7 may be formed from the intermediate structure 600 of FIG. 6 by forming a first patterned photoresist 702 over the over the intermediate structure 600 of FIG. 6 and using the first patterned photoresist 702 as an etch mask during a further anisotropic etch of the top silicon layer 408, as shown. In this regard, a blanket layer of photoresist (not shown) may be deposited or coated over the intermediate structure 600 of FIG. 7. The blanket layer of photoresist may then be patterned using lithographic techniques to form the first patterned photoresist 702 shown in FIG. 7. The etch process may then be performed to increase an etch depth of portions of the top silicon layer 408. As shown, the first patterned photoresist 702 includes openings corresponding to the etched regions (602*b*, 602*c*, 602*d*, 602*e*, 602*f*, 602*g*) of FIG. 6. As such, the etch process further increases a depth of etched regions (602*b*, 602*c*, 602*d*, 602*e*, 602*f*, 602*g*).

In addition to deepening the etched regions (602*b*, 602*c*, 602*d*, 602*e*, 602*f*, 602*g*), the first patterned photoresist 702 may be configured to change a shape of the first etched region 602*a* of FIG. 6. In this regard, the first patterned photoresist 702 may include a first masking portion 702*a* and a second masking portion 702*b*. The first masking portion 702*a* may mask a portion of the multi-layer structure 501, while the second masking portion 702*b* may cover a top surface region of the top silicon layer 408 in a portion of the first etched region 602*a*. As such, the etch process performed to generate the intermediate structure 700 of FIG. 7 may further generate an eighth etched region 602*h* and a ninth etched region 602*i*. The etching process may act to reduce a thickness of the top silicon layer 408 in the etched regions (602*b*, 602*c*, 602*d*, 602*e*, 602*f*, 602*g*, 602*h*, 602*i*) to a fourth thickness 610 that may be approximately 130 nm. As such, the third thickness 608 indicated a thickness of removed silicon from the top silicon layer 408 may be increased to a value that may be approximately 140 nm. The above-described thicknesses are only provided as examples. Various other thicknesses may be generated in other embodiments. In an alternative process, the second masking portion 702*b* may be omitted, as described in greater detail with reference to FIG. 28, below.

Figure 8:
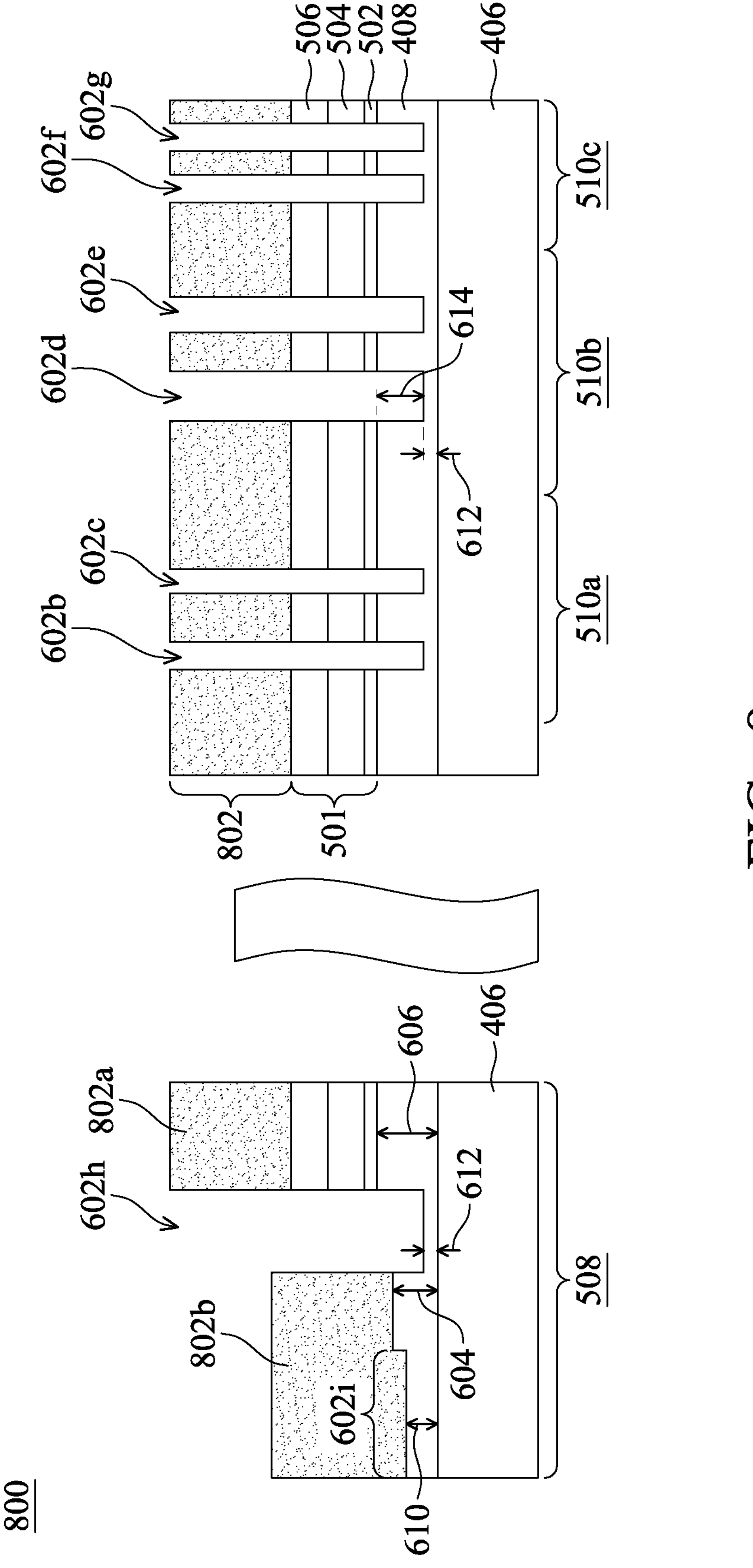
FIG. 8 is a vertical cross-sectional view of a further intermediate structure that may be used to form one or more photonic devices, according to various embodiments.

FIG. 8 is a vertical cross-sectional view of a further intermediate structure 800 that may be used to form one or more photonic devices, according to various embodiments. The intermediate structure 800 may be formed from the intermediate structure 700 of FIG. 7 by performing a further etching process that acts to deepen the etched regions (602*b*, 602*c*, 602*d*, 602*e*, 602*f*, 602*g*, 602*h*) while not further etching etched region 602*i*. In this regard, the first patterned photoresist 702 of FIG. 7 may be modified or replaced to form the second patterned photoresist 802 of FIG. 8. The second patterned photoresist 802 may have a similar configuration to that of the first patterned photoresist 702 with the exception of the second masking portion 802*b*. As shown, the second masking portion 802*b* further covers the ninth etched region 602*i* in addition to the portion of the top silicon layer 408 covered by the second masking portion 702*b* of the first patterned photoresist 702 (e.g., see FIG. 7). The etching process further deepens the etched regions (602*b*, 602*c*, 602*d*, 602*e*, 602*f*, 602*g*, 602*h*) such that a thickness of the top silicon layer 408 is reduced to fifth thickness 612 that may have a value that is approximately 70 nm. As such, a sixth thickness 614 that indicated thickness of silicon removed from the top silicon layer 408 may have a value that is approximately 200 nm. These thickness values are provided merely as examples and various other thicknesses may be used in other embodiments.

Figure 9:
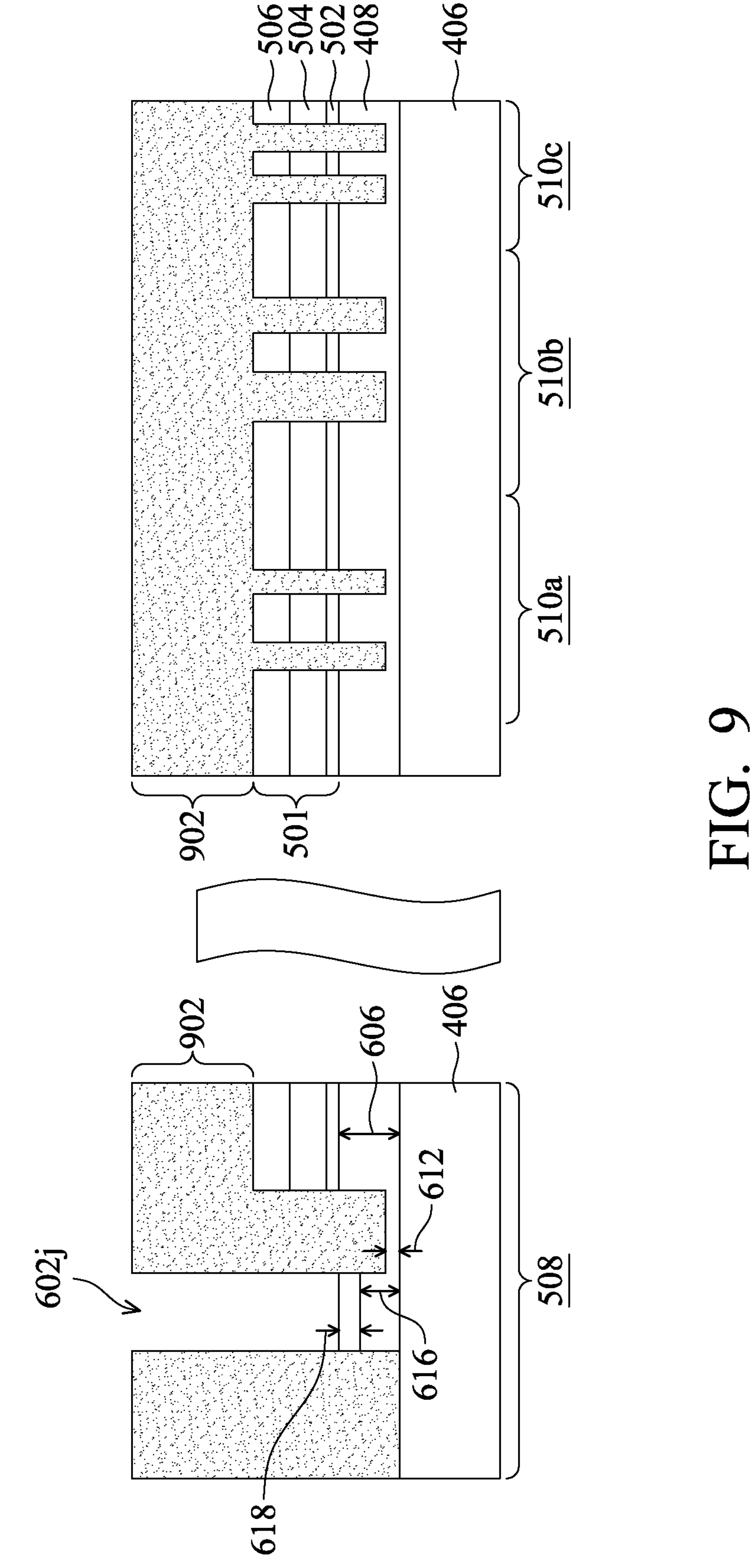
FIG. 9 is a vertical cross-sectional view of a further intermediate structure that may be used to form one or more photonic devices, according to various embodiments.

FIG. 9 is a vertical cross-sectional view of a further intermediate structure 900 that may be used to form one or more photonic devices, according to various embodiments. The intermediate structure 900 may be formed from the intermediate structure 800 of FIG. 8 by forming a third patterned photoresist 902. As shown, the third patterned photoresist 902 masks all of the etched regions (602*b*, 602*c*, 602*d*, 602*e*, 602*f*, 602*g*, 602*h*, 602*i*) while leaving an exposed region to thereby generate a tenth etched region 602*j*. The etching process may be performed to reduce a thickness of the top silicon layer 408 to a seventh thickness 616 that may have a value that is approximately 175 nm. In this regard, an eighth thickness 618 characterizing a thickness of silicon removed from the top silicon layer 408 may have a value that is approximately 95 nm. As in all disclosed embodiments, the above-described thicknesses are provided merely as examples. Various other thicknesses may be generated in other embodiments.

Figure 10:
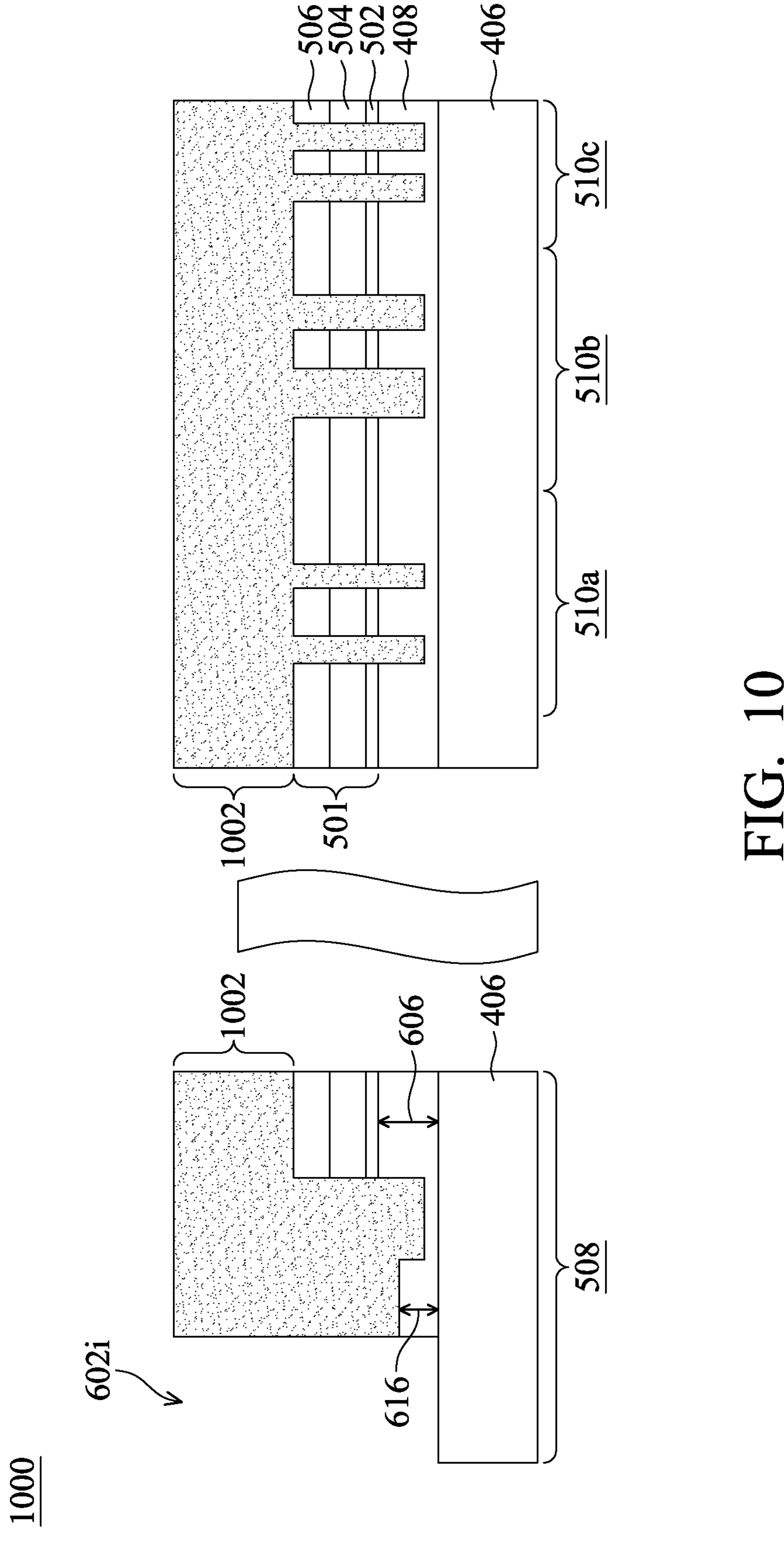
FIG. 10 is a vertical cross-sectional view of a further intermediate structure that may be used to form one or more photonic devices, according to various embodiments.
Figure 11:
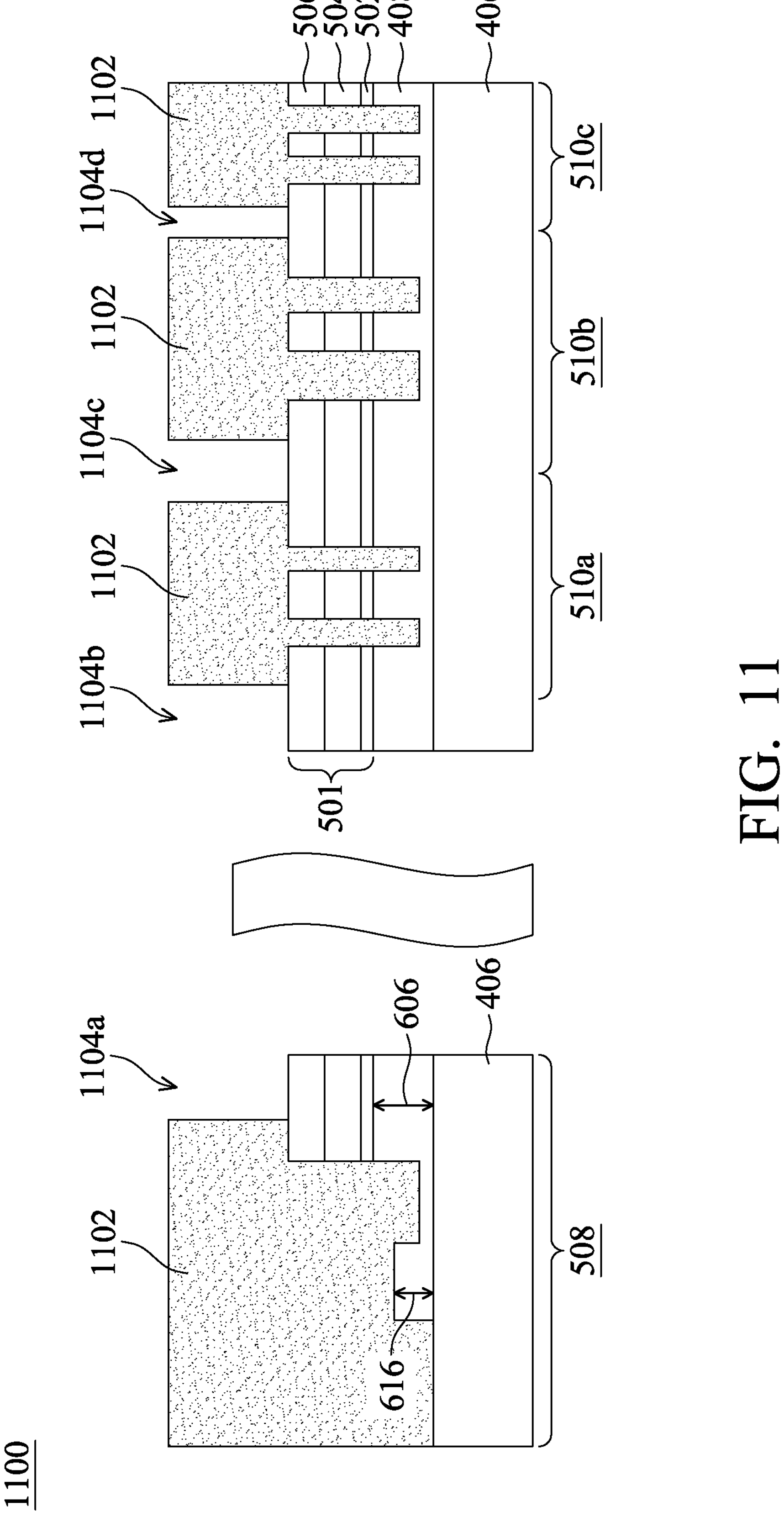
FIG. 11 is a vertical cross-sectional view of a further intermediate structure that may be used to form one or more photonic devices, according to various embodiments.
Figure 12:
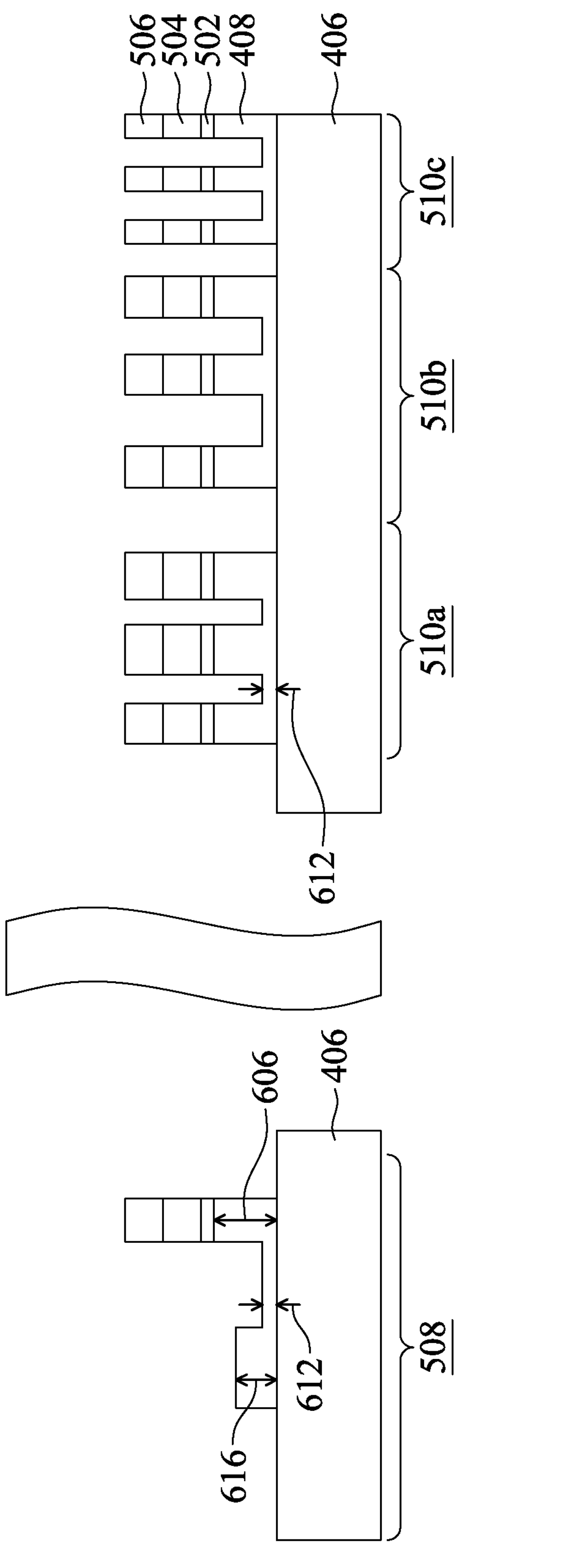
FIG. 12 is a vertical cross-sectional view of a further intermediate structure that may be used to form one or more photonic devices, according to various embodiments.

FIGS. 10 to 12 are vertical cross-sectional views of respective intermediate structures 1000, 1100, and 1200 that may be used to generate discrete silicon structures for respective discrete photonic devices. The intermediate structure 1000 includes a fourth patterned photoresist 1002 that may be configured to mask all of the (602*b*, 602*c*, 602*d*, 602*e*, 602*f*, 602*g*, 602*h*, 602*j*) while leaving etched region 602*i* exposed. An etch process may then be performed to remove the remaining portion of the top silicon layer 408 in etched region 602*i*. The intermediate structure 1100 of FIG. 11 may include a fifth patterned photoresist 1102 that may include exposed portions (1104*a*, 1104*b*, 1104*c*, 1104*d*).

A deep trench etch process may then be performed using the fifth patterned photoresist to remove portions of the multi-layer structure 501 in the exposed portions (1104*a*, 1104*b*, 1104*c*, 1104*d*). The fifth patterned photoresist 1102 may then be removed by ashing or by dissolution with a solvent to generate the intermediate structure 1200 of FIG. 12. The resulting intermediate structure 1200 includes respective discrete silicon structures in the first photonic device region 508, the second photonic device region 510*a*, the third photonic device region 510*b*, and the fourth photonic device region 510*c*. As described in greater detail with reference to FIGS. 13 to 27, the discrete silicon structures in the first photonic device region 508, the second photonic device region 510*a*, the third photonic device region 510*b*, and the fourth photonic device region 510*c* may be used to generate a SISCAP modulator, a first p-n junction electro-optic modulator, a second p-n junction electro-optic modulator, and an optical waveguide, respectively (e.g., see FIG. 27).

Figure 13:
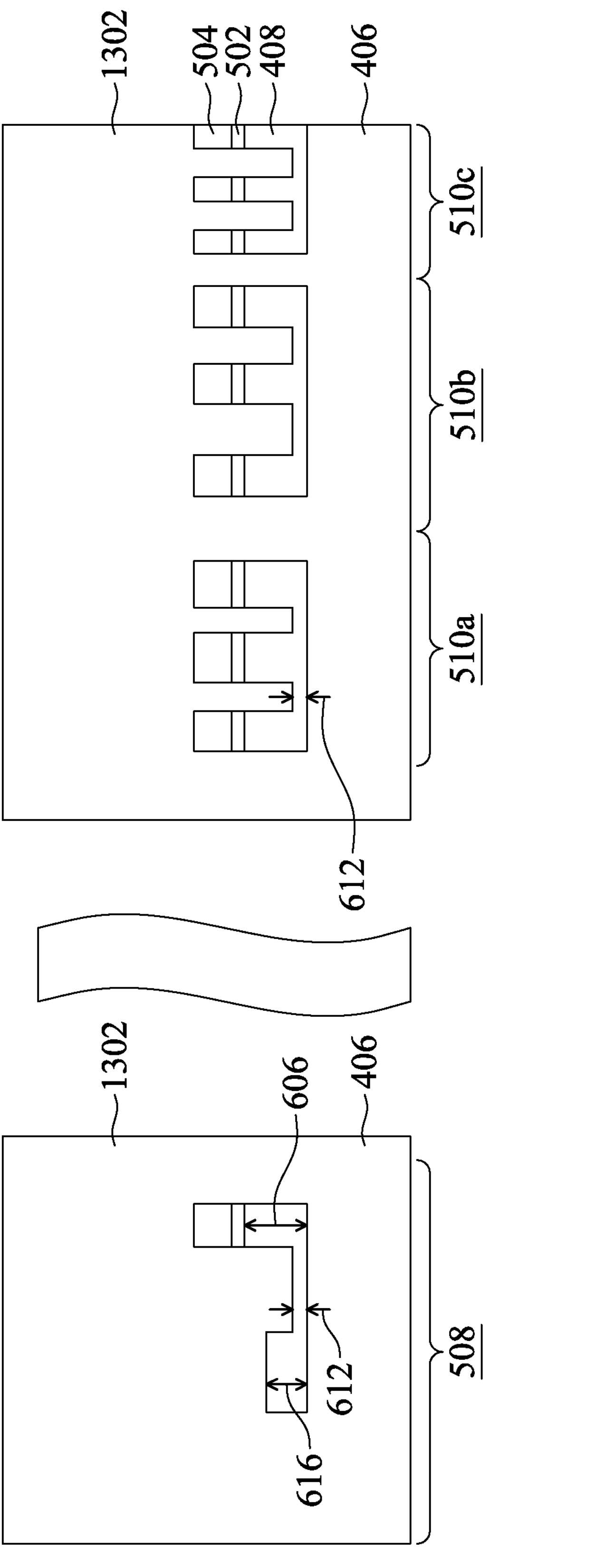
FIG. 13 is a vertical cross-sectional view of a further intermediate structure that may be used to form one or more photonic devices, according to various embodiments.
Figure 14:
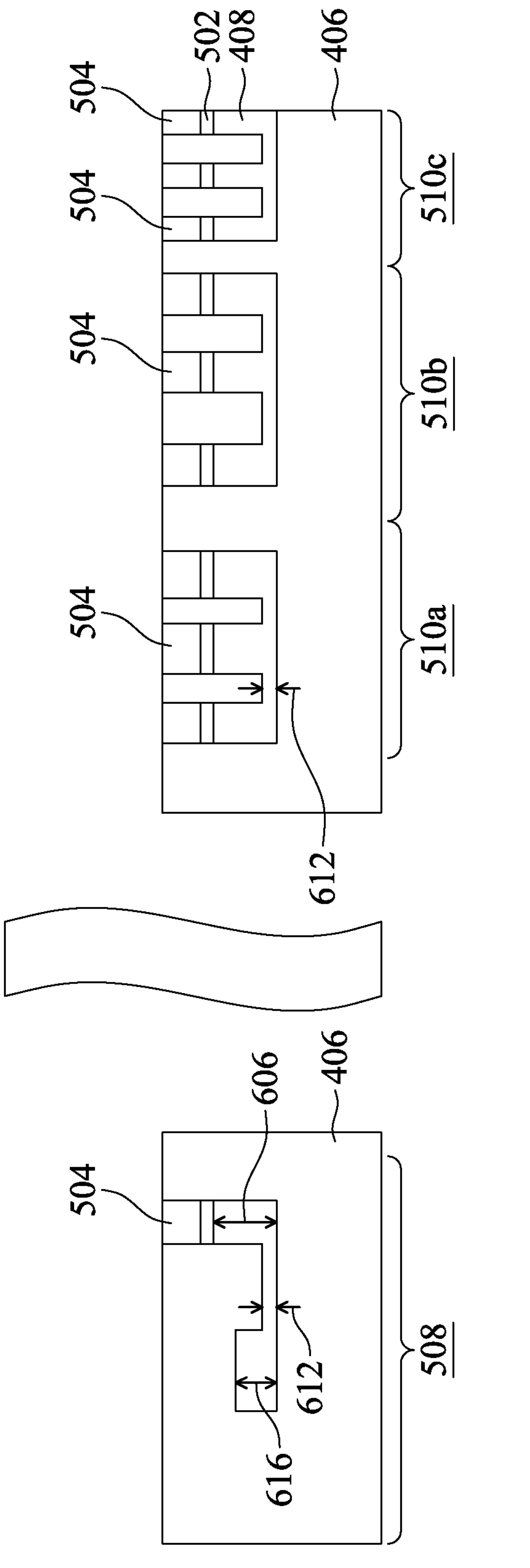
FIG. 14 is a vertical cross-sectional view of a further intermediate structure that may be used to form one or more photonic devices, according to various embodiments.
Figure 27:
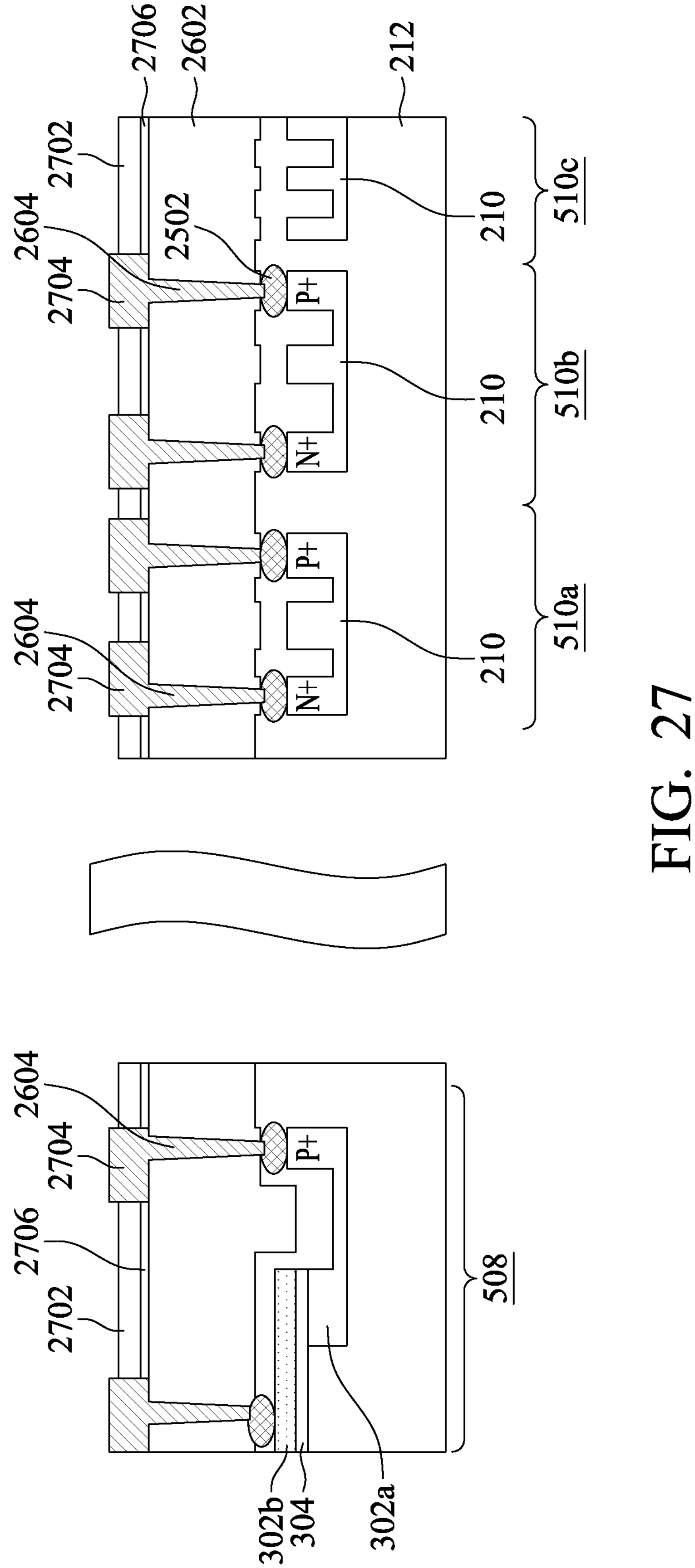
FIG. 27 is a vertical cross-sectional view of photonic devices formed in respective photonic device regions, according to various embodiments.

FIGS. 13 and 14 are vertical cross-sectional views of further intermediate structures 1300 and 1400 that may be used to form the photonic devices of FIG. 27, according to various embodiments. The intermediate structure 1300 of FIG. 13 may be formed by depositing a layer of an oxide (e.g., cladding dielectric layer 1302) over the intermediate structure 1200 of FIG. 12. For example, the cladding dielectric layer 1302 may be a high-density plasma (HDP) oxide that may be deposited using chemical vapor deposition (CVD). As shown, the cladding dielectric layer 1302 may surround the discrete structures in the first photonic device region 508, the second photonic device region 510*a*, the third photonic device region 510*b*, and the fourth photonic device region 510*c* including filling deep trench regions within the respective discrete structures. As shown in FIG. 14, a planarization process (e.g., chemical mechanical planarization (CMP)) may then be performed to remove a top portion of the cladding dielectric layer 1302. The planarization process may be performed to remove a sufficient amount of the cladding dielectric layer 1302 and top portions of the low-k dielectric layer 506 (e.g., see FIG. 12) to thereby expose top surfaces of remaining portions of the SiN layer 504.

Figure 15:
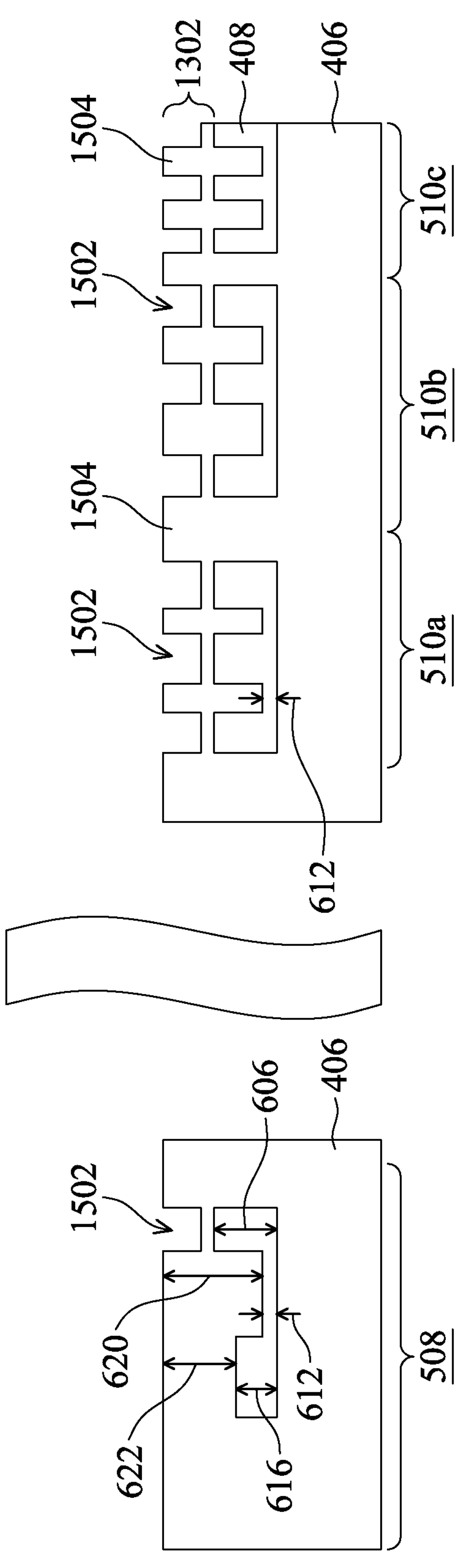
FIG. 15 is a vertical cross-sectional view of a further intermediate structure that may be used to form one or more photonic devices, according to various embodiments.

FIG. 15 is a vertical cross-sectional view of a further intermediate structure 1500 that may be used to form one or more photonic devices, according to an embodiment. FIG. 15 may be formed from the intermediate structure 1400 of FIG. 14 by performing an anisotropic etching process to thereby remove the remaining portions of the SiC layer 504 (e.g., see FIG. 14). In this regard, a patterned photoresist (not shown) may be formed over the intermediate structure 1400 of FIG. 14 and the patterned photoresist may be used as an etch mask during the etching process that removes the remaining portions of the SiC layer 504. The patterned photoresist may then be removed by ashing or by dissolution with a solvent.

The resulting intermediate structure 1500 may include a corrugated surface structure in the second photonic device region 510*a*, the third photonic device region 510*b*, and the fourth photonic device region 510*c*. As shown, the corrugated structure may include trench portions 1502 separated by raised portions 1504 in the surface of the oxide layer 1302. As shown, the cladding dielectric layer 1302 may have a depth over the discrete silicon structure in the second photonic device region 510*a* having a ninth thickness 620 and a tenth thickness 622 having values that may be in a range from approximately 100 nm to approximately 300 nm. For example, in some embodiments, the ninth thickness 620 may be 250 nm and the tenth thickness 622 may be 145 nm. These thickness values are provided merely as examples and various other thicknesses may be used in other embodiments. These thickness values may allow the second terminal 302*b* (e.g., see FIG. 22) to be as small as possible while maintaining desirable properties (e.g., large enough to provide sufficient charge to cause a desired change in optical properties).

Figure 16:
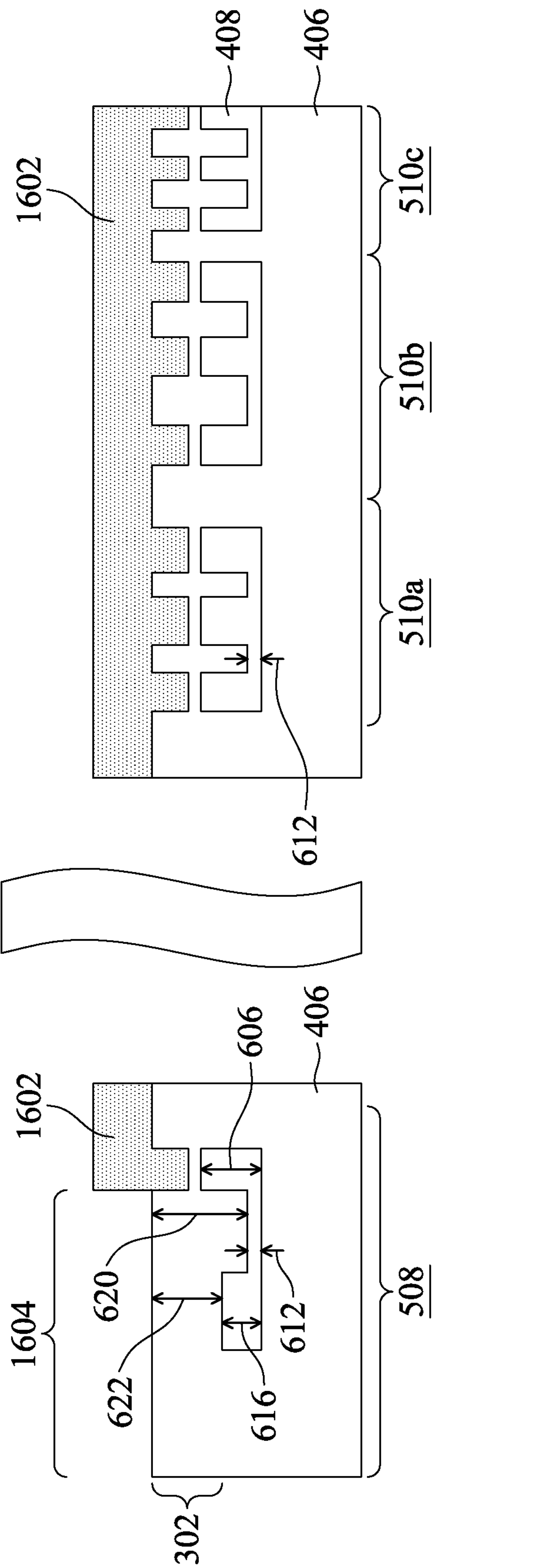
FIG. 16 is a vertical cross-sectional view of a further intermediate structure that may be used to form one or more photonic devices, according to various embodiments.
Figure 17:
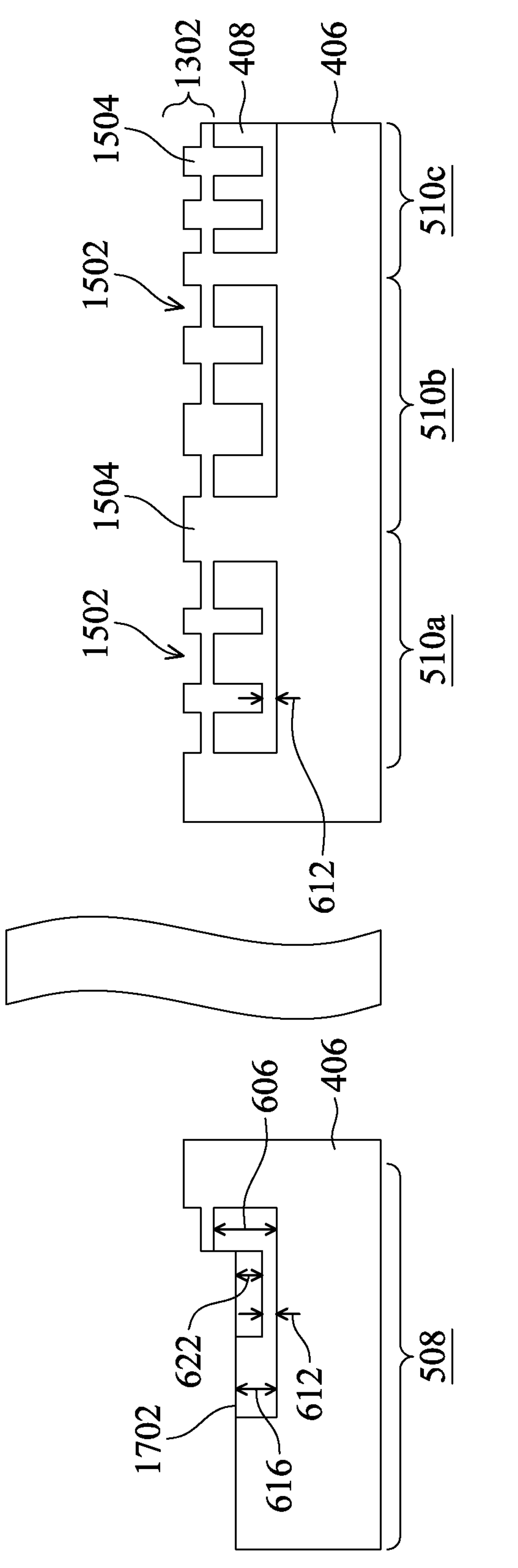
FIG. 17 is a vertical cross-sectional view of a further intermediate structure that may be used to form one or more photonic devices, according to various embodiments.

FIGS. 16 and 17 are vertical cross-sectional views of further intermediate structures 1600 and 1700 that may be used to form the photonic devices of FIG. 27, according to various embodiments. In this regard, the intermediate structure 1600 may be formed from the intermediate structure 1500 of FIG. 15 by forming a sixth patterned photoresist 1602 over the intermediate structure 1500 of FIG. 15. As shown, the sixth patterned photoresist 1602 masks the structures in the second photonic device region 510*a*, the third photonic device region 510*b*, and the fourth photonic device region 510*c* while leaving an exposed portion 1604 of the structure in the first photonic device region 508.

The sixth patterned photoresist 1602 may then be used to perform an anisotropic etch process to remove a portion of the oxide layer 1302 over the structure in the first photonic device region 508. The sixth patterned photoresist 1602 may then be removed by ashing or by dissolution with a solvent. The resulting intermediate structure 1700 is shown in FIG. 17. As shown, the intermediate structure 1700 in the first photonic device region 508 may include an exposed top surface 1702 of the silicon structure and a remaining portion of the oxide layer. The remaining portion of the oxide layer may have a tenth thickness 622 having a value that is approximately 104 nm. As in other embodiments, the thicknesses shown in FIG. 17 are provided merely as examples. Various other thicknesses may be generated in other embodiments. A blanket layer of a sacrificial oxide (not shown) may then be deposited over the intermediate structure 1700 prior to performing doping processes that are described in greater detail with reference to FIG. 18, below. In an example embodiment, the sacrificial oxide layer may have a thickness in a range from approximately 8 nm to 10 nm.

Figure 18:
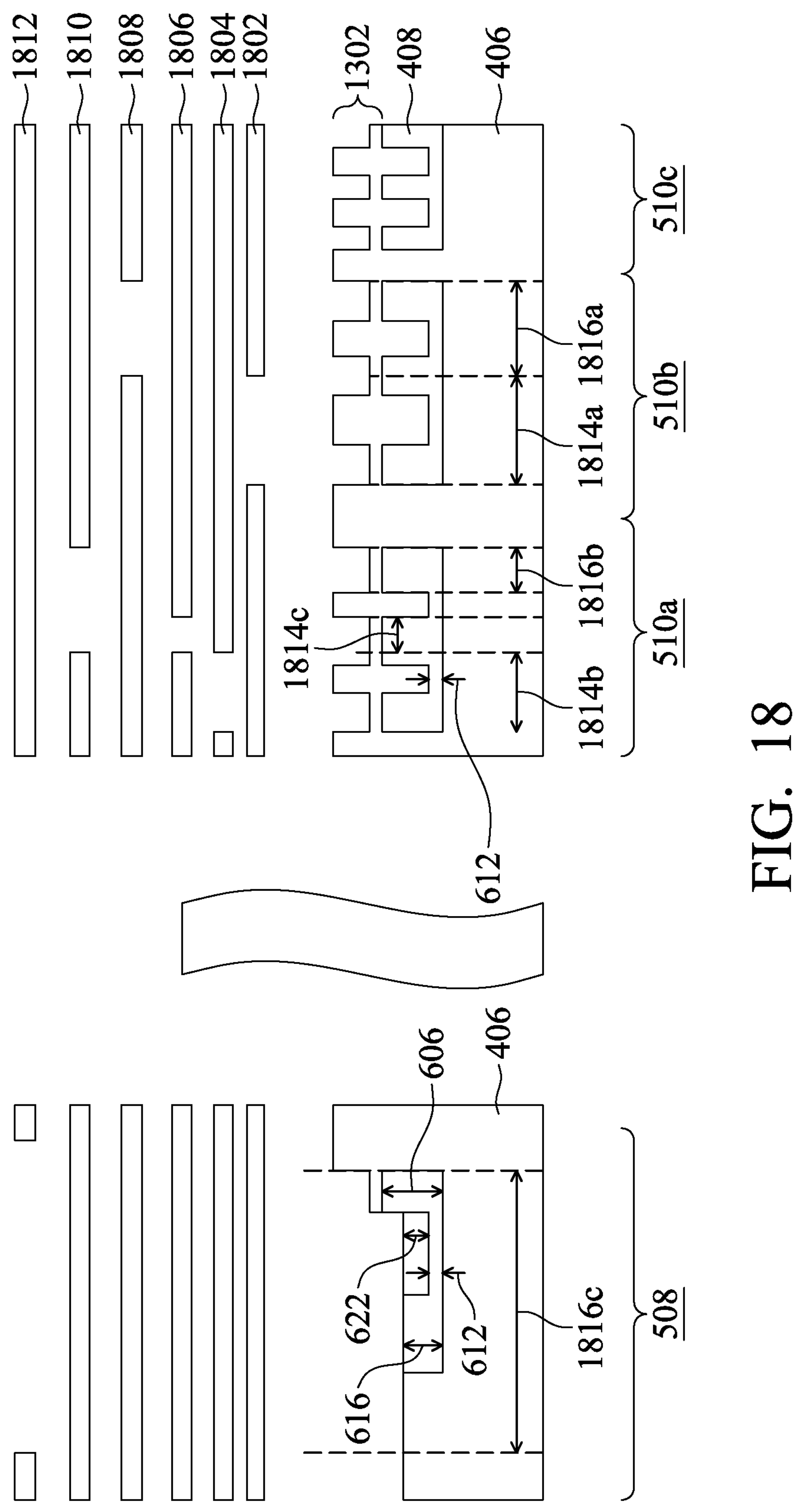
FIG. 18 illustrates a vertical cross-sectional view of a further intermediate structure along with a plurality of masking structures that may be used to selectively dope various portions of the structures of FIG. 17 to form the intermediate structure of FIG. 18, according to various embodiments.

FIG. 18 illustrates a vertical cross-sectional view of a further intermediate structure 1800 along with a plurality of masking structures that may be used to selectively dope various portions of the structures of FIG. 17 to form the intermediate structure of FIG. 18, according to various embodiments. A first masking structure 1802 may have an opening located over a portion of the structure within the third photonic device region 510*b*. Using the first masking structure 1802, a doping procedure may be performed to introduce n-type dopants into the structure of the third photonic device region 510*b* to thereby form a first n-type well 1814*a*. Similarly, the second masking structure 1804 may be used to introduce n-type dopants into the structure of the second photonic device region 510*a* to thereby form a second n-type well 1814*b*.

As shown, the third masking structure 1806, the fourth masking structure 1808, and the fifth masking structure 1810 may then be used to respectively generate a third n-type well 1814*c* in the second photonic device region 510*a*, a first p-type well 1816*a* in the fourth photonic device region 510*c*, and a second p-type well 1816*b* in the third photonic device region 510*b*. The sixth masking structure 1812 may then be used to introduce p-type dopants into the structure formed in the first photonic device region 508 to form a third p-type well 1816*c*. As shown, the various masking structures (1802, 1804, 1806, 1808, 1810, 1812) protect the silicon structure within the fourth photonic device region 510*c* since, as mentioned above, the structure in the fourth photonic device region 510*c* will be used to form a photonic waveguide structure and should therefore remain undoped.

FIG. 19A is a vertical cross-sectional view of a further intermediate structure 1900 that may be used to form one or more photonic devices, and FIGS. 19B to 19E illustrate details of an oxide formation process, according to various embodiments. The intermediate structure 1900 of FIG. 19A may be formed from intermediate structure 1800 of FIG. 18 by forming a capacitor dielectric layer 1902 and a polysilicon layer 1904 over the intermediate structure 1800 of FIG. 18. Prior to forming the polysilicon layer 1904, the blanket sacrificial oxide layer may be removed using an anisotropic etch process. The capacitor dielectric layer 1902 may be formed in several processing stages as shown, for example, in FIGS. 19C to 19E. FIGS. 19C to 19E illustrate a portion 1905 of the structure shown in FIG. 19B. In a first process stage, as shown in FIG. 19C, a gate oxide layer 1906 (e.g., a silicon dioxide ($SiO_2$) layer) may be formed over a portion of the top silicon layer 408. The gate oxide layer 1906 may be formed using an in-situ steam generation (ISSG) process or a rapid thermal oxidation (TRO) process. In a second process stage, as shown in FIG. 19D, a decoupled plasma nitridation (DPN) process may be performed to thereby incorporation nitrogen into the gate oxide layer 1906 to thereby form a silicon oxynitride SiON layer 1908. In a third process stage, as shown in FIG. 19E, the resulting capacitor dielectric layer 1902 (i.e., a silicon oxynitride layer) may be formed by performing a post nitridation anneal process on the SiON layer 1908. After formation of the capacitor dielectric layer 1902, the polysilicon layer 1904 may be deposited over the capacitor dielectric layer 1902 using low pressure CVD.

Figure 20:
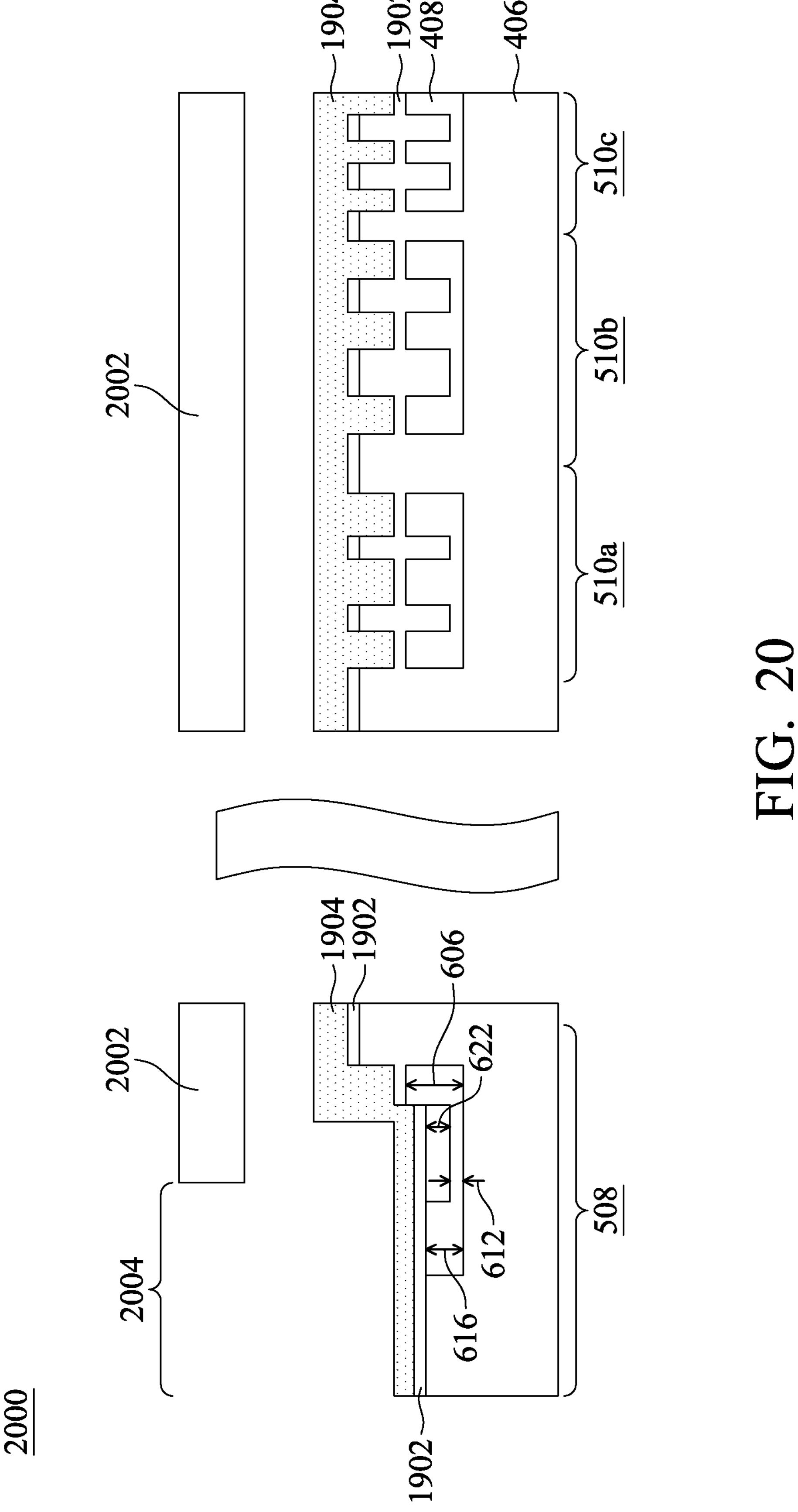
FIG. 20 is a vertical cross-sectional view of a further intermediate structure that may be used to form one or more photonic devices, according to various embodiments.

FIG. 20 is a vertical cross-sectional view of a further intermediate structure 2000 that may be used to form one or more photonic devices, according to various embodiments. The intermediate structure 2000 may be formed from the intermediate structure 1900 of FIG. 19A by doping a portion of the polysilicon layer in the first photonic device region 508. For example, a seventh masking structure 2002 may be used to mask the intermediate structure 1900 of FIG. 19A with the exception of a polysilicon doping region 2004 over a portion of the structure formed in the first photonic device region 508. A doping process may then be performed to introduce n-type dopants into the unmasked polysilicon doping region 2004.

Figure 21:
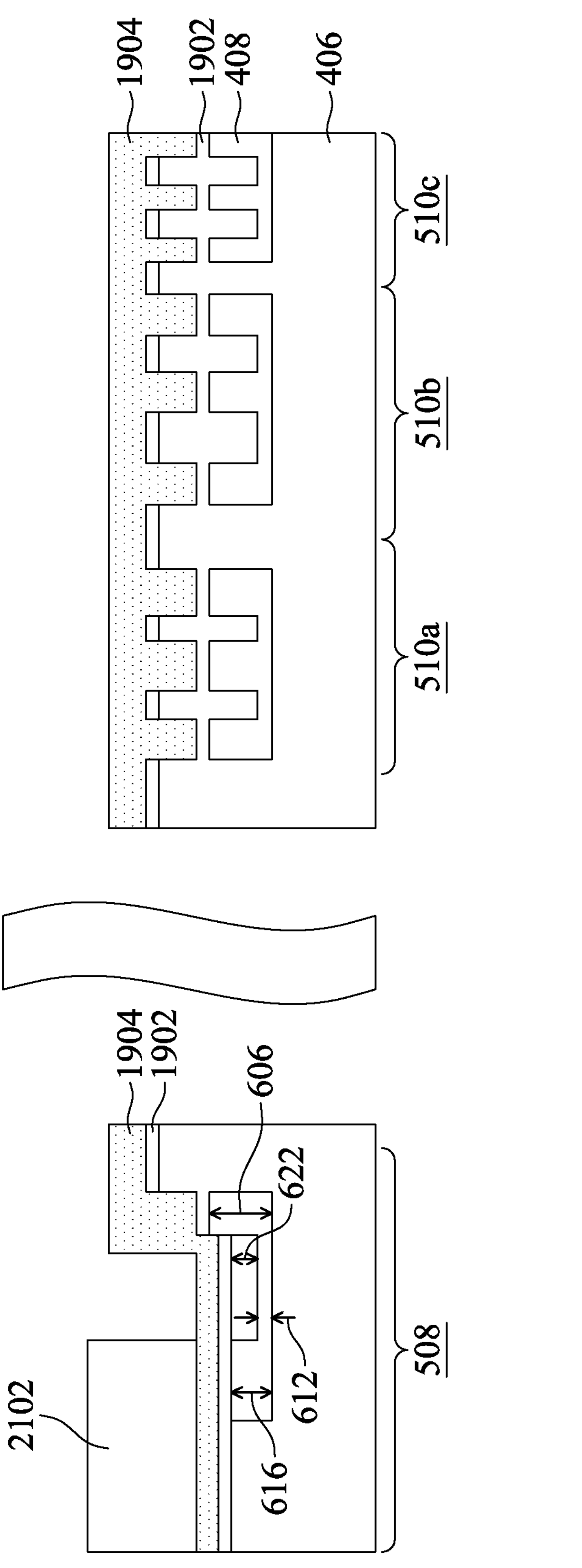
FIG. 21 is a vertical cross-sectional view of a further intermediate structure that may be used to form one or more photonic devices, according to various embodiments.
Figure 22:
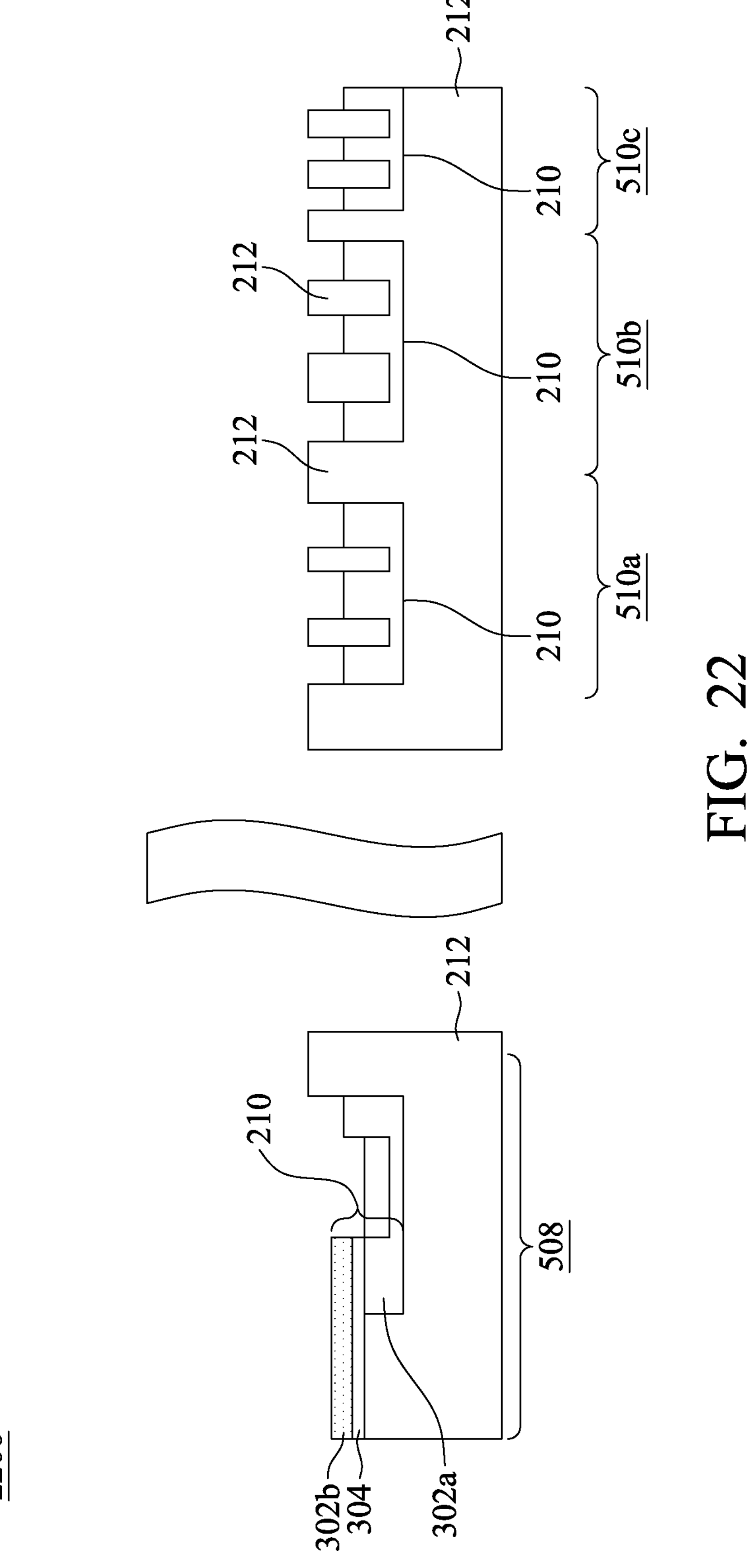
FIG. 22 is a vertical cross-sectional view of a further intermediate structure that may be used to form one or more photonic devices, according to various embodiments.

FIGS. 21 and 22 are vertical cross-sectional views of further intermediate structures 2100 and 2200, respectively, that may be used to form one or more photonic devices, according to various embodiments. In this regard, a seventh patterned photoresist 2102 may be formed over a portion of the polysilicon layer 1904 corresponding to the polysilicon doping region 2004 (e.g., see FIG. 20). An anisotropic etching process may then be performed to remove the portions of the polysilicon layer 1904 that are not masked by the seventh patterned photoresist 2102. The seventh patterned photoresist 2102 may then be removed by ashing or by dissolution with a solvent.

The resulting intermediate structure 2200 is shown in FIG. 22. As shown, in the first photonic device region 508, the intermediate structure 2200 may include the first semiconductor structure 302*a*, the second semiconductor structure 302*b*, and the insulator 304 of the first SISCAP modulator 300*a* described above with reference to FIG. 3B. As such, the first semiconductor structure 302*a*, the second semiconductor structure 302*b*, and the insulator 304 may form the core portion 210 of the first SISCAP modulator 300*b* that is surrounded by the cladding portion 212. Similarly, in the second photonic device region 510*a*, the third photonic device region 510*b*, and the fourth photonic device region 510*c*, the intermediate structure 2200 may include respective core portions 210 of a first electro-optic p-n junction modulator, a second electro-optic p-n junction modulator, and a photonic waveguide to be subsequently formed (e.g., see FIG. 27, below). Further, as described above with reference to FIGS. 2B and 2C, each of the core portions 210 may be surrounded (at least partially) by the cladding portion 212. In an alternative process, described below with reference to FIGS. 28 to 31, the second SISCAP modulator 300*b* of FIG. 3B may be similarly formed (e.g., with processes corresponding to FIGS. 28 to 31 replacing those of FIGS. 7, 10, 11, and 12, respectively, and with processes corresponding to FIGS. 8 and 9 omitted).

Figure 23:
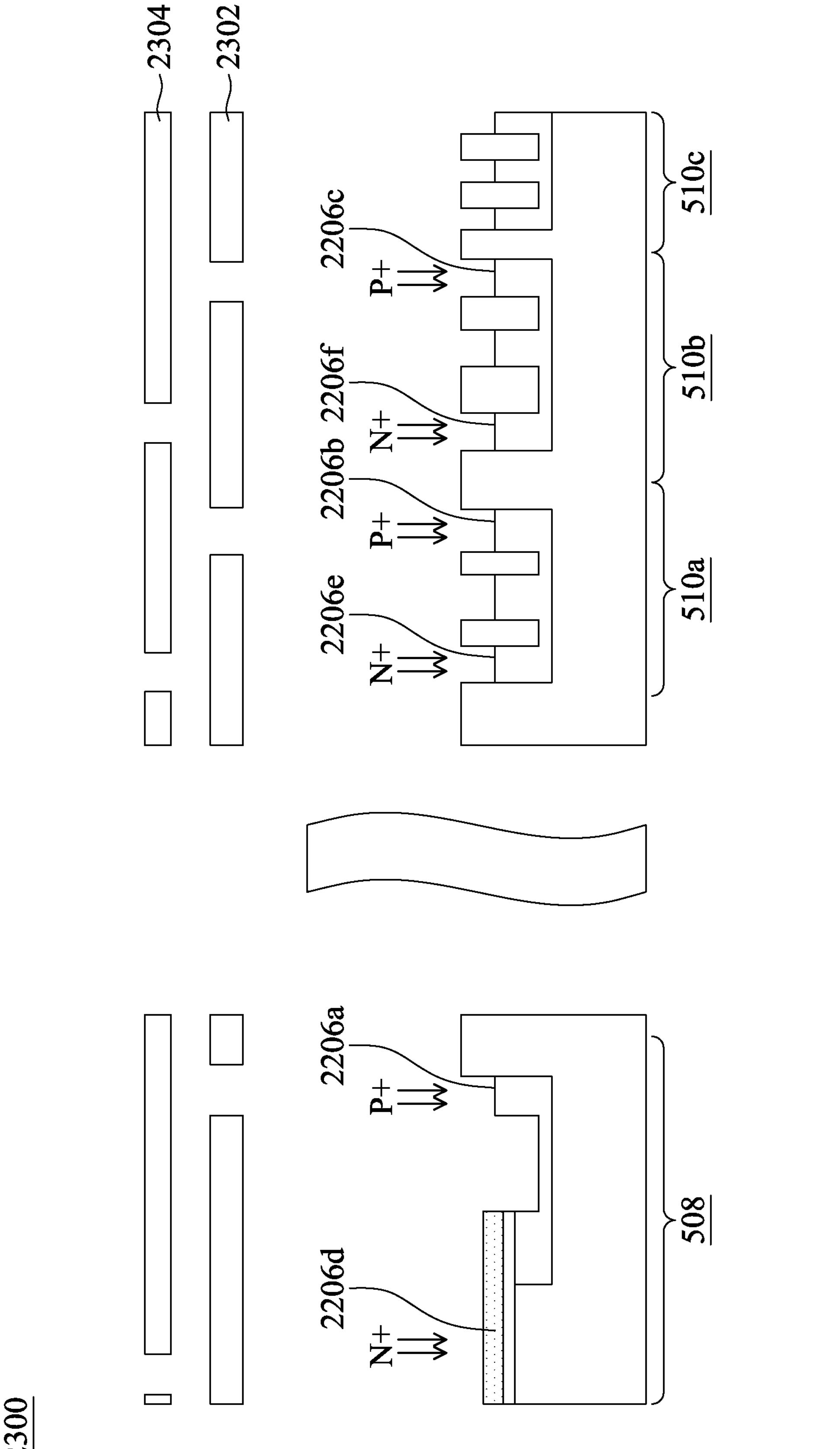
FIG. 23 illustrates a vertical cross-sectional view of a further intermediate structure along with a plurality of masking structures that may be used to selectively dope various portions of the structures of FIG. 22 to form the intermediate structure of FIG. 23, according to various embodiments.

FIG. 23 illustrates a vertical cross-sectional view of a further intermediate structure along with a plurality of masking structures that may be used to selectively dope various portions of the structures of FIG. 22 to form the intermediate structure of FIG. 23, according to various embodiments. Using an eighth masking structure 2302, a doping process may be performed to introduce p-type dopants into unmasked portions of the first photonic device region 508, the second photonic device region 510*a*, and the third photonic device region 510*b*. In this regard, a first region 2206*a* of the first photonic device region 508 may be doped to form a first terminal of the first SISCAP modulator 300*a* (e.g., see FIG. 3A), a second region 2206*b* of the second photonic device region 510*a* may be doped to form a first terminal of a first electro-optic p-n junction modulator (e.g., see FIG. 2C), and a third region 2206*c* of the third photonic device region 510*b* may be doped to form a first terminal of a second first electro-optic p-n junction modulator.

Similarly, a ninth masking structure 2304 may be used to introduce n-type dopants into unmasked portions of the first photonic device region 508, the second photonic device region 510*a*, and the third photonic device region 510*b*. In this regard, a fourth region 2206*d* of the first photonic device region 508 may be doped to form a second terminal of the first SISCAP modulator 300*a* (e.g., see FIG. 3A), a fifth region 2206*e* of the second photonic device region 510*a* may be doped to form a second terminal of the first electro-optic p-n junction modulator (e.g., see FIG. 2C), and a sixth region 2206*f* of the third photonic device region 510*b* may be doped to form a second terminal of the second electro-optic p-n junction modulator.

Figure 24:
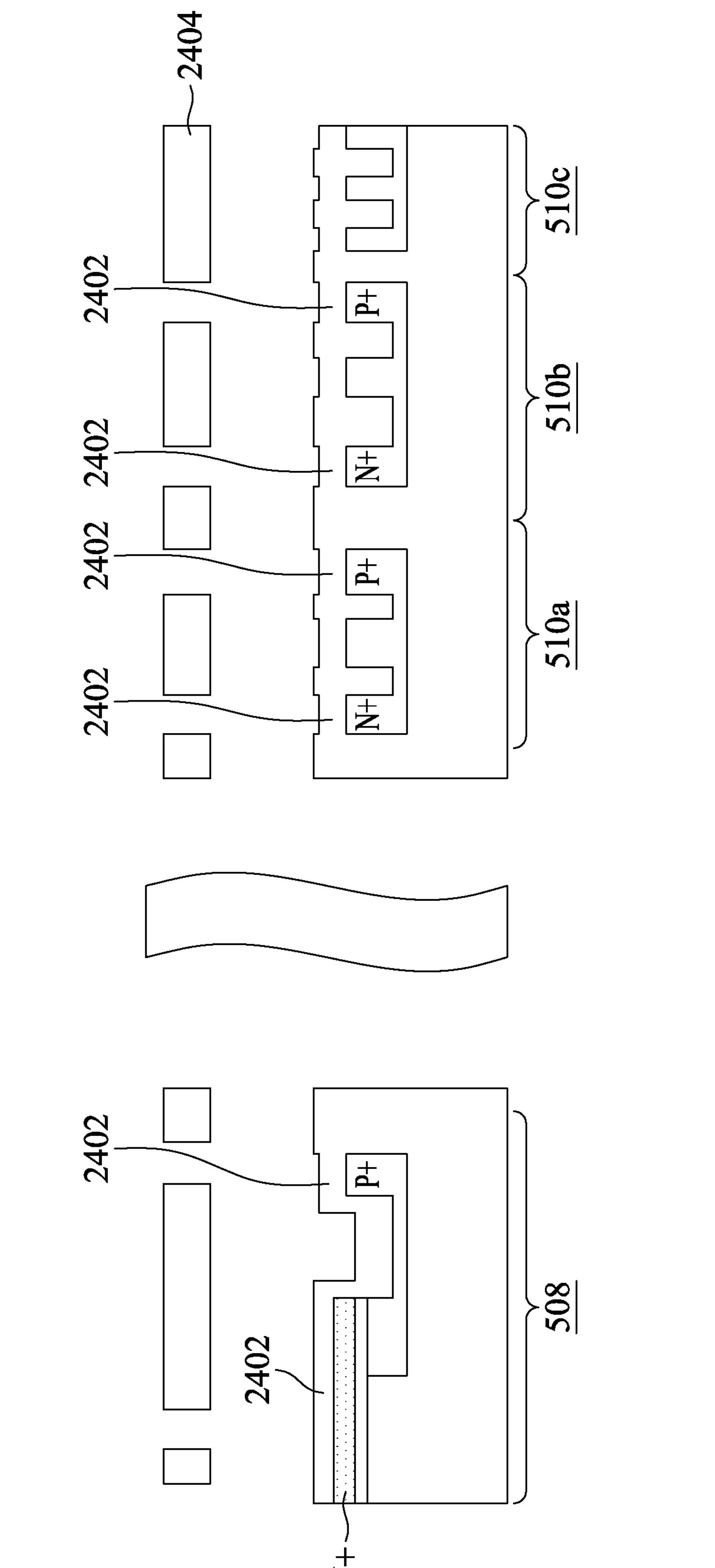
FIG. 24 is a vertical cross-sectional view of a further intermediate structure that may be used to form one or more photonic devices, according to various embodiments.
Figure 25:
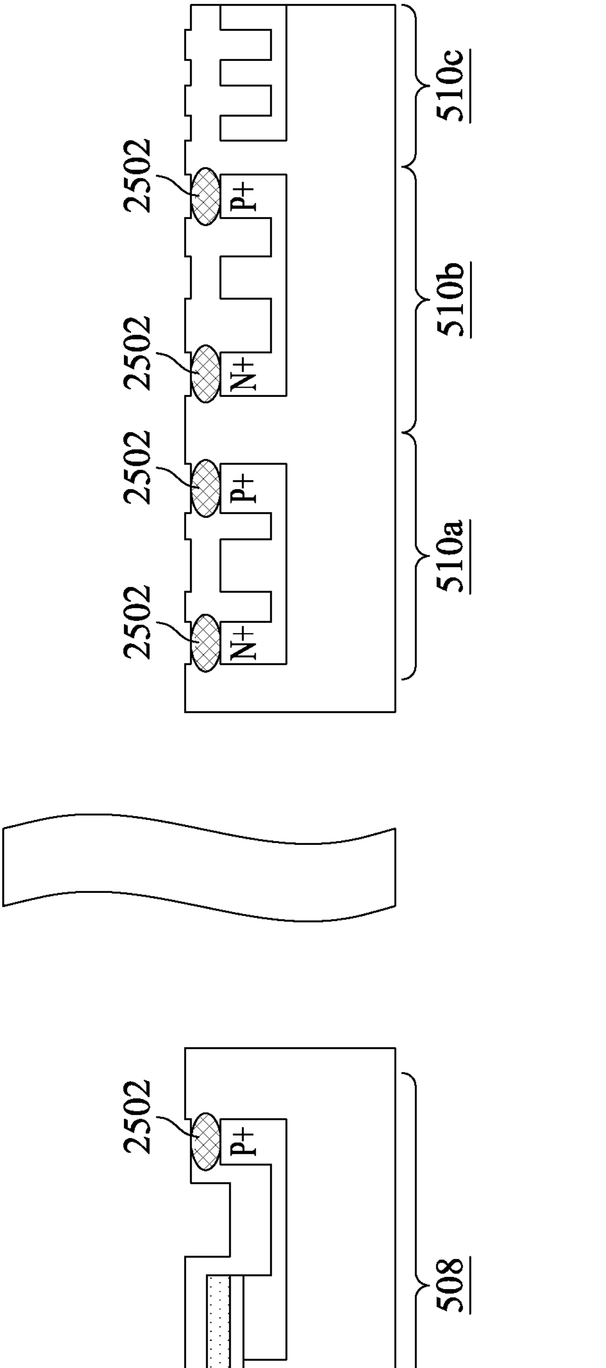
FIG. 25 is a vertical cross-sectional view of a further intermediate structure that may be used to form one or more photonic devices, according to various embodiments.

FIGS. 24 and 25 are vertical cross-sectional views of further intermediate structures 2400 and 2500, respectively, that may be used for form one or more photonic devices, according to various embodiments. The intermediate structure 2400 of FIG. 24 may be formed by forming a resistive protective oxide (RPO) layer 2402 over the intermediate structure 2300 of FIG. 23. After deposition of the RPO layer an anisotropic etch process may be performed to generate holes in the RPO layer. Metal ions (e.g., Ni, Ti, Co, Hf, Mn, Pd, Pt, Ta, W, Zr) may then be introduced into localized doped regions exposed by the holes in the RPO layer. The metal ions may be introduced using a process of evaporation, sputtering, or CVD processes. In this regard, a tenth masking structure 2404 may be used to mask the intermediate structure 2400 such that metal ions are only introduced in regions that are not masked by the tenth masking structure 2404. After the introduction of metal ions, the intermediate structure 2400 may be subjected to a rapid thermal anneal (RTA) process. In this way, self-aligned silicides (i.e., salicides) 2502 may be formed over respective first and second terminals of the respective devices in the first photonic device region 508, the second photonic device region 510*a*, and the third photonic device region 510*b* as shown, for example, in FIG. 25. The salicides 2502 may include various silicon/metal compounds such as $CoSi_2$, $HfSi_2$, $MoSi_2$, $NiSi_2$, $Pd_2Si$, PtSi, $TaSi_2$, $TiSi_2$, $WSi_2$, $ZrSi_2$, etc.

Figure 26:
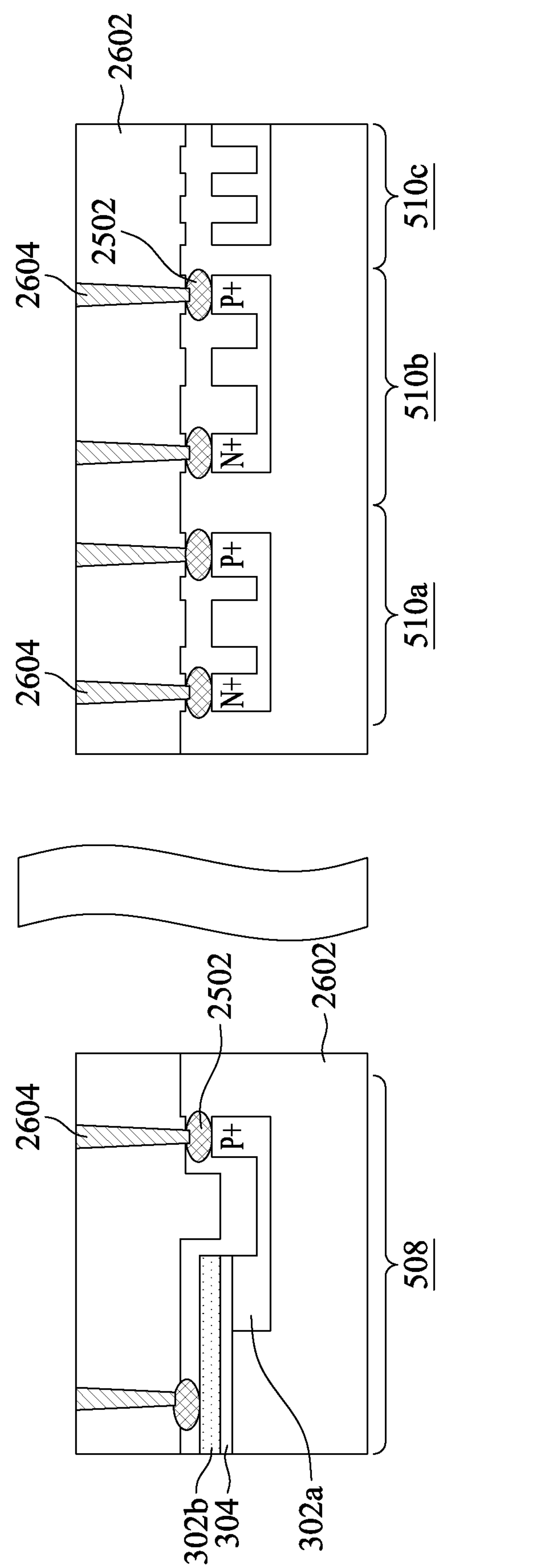
FIG. 26 is a vertical cross-sectional view of a further intermediate structure that may be used to form one or more photonic devices, according to various embodiments.

FIG. 26 is a vertical cross-sectional view of a further intermediate structure 2600 that may be used to form one or more photonic devices, according to various embodiments. The intermediate structure 2600 may be formed from the intermediate structure 2500 of FIG. 25 by forming a cladding layer 2602 over the intermediate structure 2500 of FIG. 25. In this example embodiment, the cladding layer 2602 may be include a thin SiC layer (not shown) having a thickness of approximately 30 nm. The SiC layer may be deposited using a plasma enhanced chemical vapor deposition (PECVD) process. The cladding layer 2602 may further include an interlayer dielectric, such a phosphosilicate glass. The phosphosilicate glass, as initially deposited as a blanket layer, may have a thickness of approximately 660 nm. A planarization process (e.g., CMP) may then be performed to planarize the cladding layer 2602. After planarization, the cladding layer 2602 may have a thickness of approximately 360 nm.

Conductive vias 2604 may then be formed in the cladding layer 2602. In this regard, a patterned photoresist (not shown) may be formed over the planarized cladding layer 2602. The patterned photoresist may then be used as a mask during an anisotropic etch process that may be performed to generate via cavities (not shown). The via cavities may then be filled with a conductive material to thereby form the conductive vias 2604. The conductive material may include a metallic liner material and a metallic fill material. The metallic liner material may include a conductive metallic nitride or a conductive metallic carbide such as TiN, TaN, WN, TiC, TaC, and/or WC. The metallic fill material may include W, Cu, Al, Co, Ru, Mo, Ta, Ti, alloys thereof, and/or combinations thereof. Other suitable conductive materials within the contemplated scope of this disclosure may also be used.

As shown in FIG. 26, the conductive vias 2604 may be formed so as to make direct electrical contact with the salicides 2502. As such, the conductive vias 2604 may be formed so as to be in direct electrical contact with the first and second terminals of the respective photonic devices formed in the first photonic device region 508, the second photonic device region 510*a*, the third photonic device region 510*b*, and the fourth photonic device region 510*c*. A planarization process (e.g., CMP) may then be performed after formation of the conductive vias 2604 to thereby generate a planar to surface to the intermediate structure 2600 of FIG. 26.

FIG. 27 is a vertical cross-sectional view of photonic devices 2700 formed in respective photonic device regions, according to various embodiments. The photonic devices 2700 may be formed from the intermediate structure 2600 of FIG. 26 by forming an interlayer dielectric 2702 over the intermediate structure 2600 of FIG. 26 and by forming electrically conductive lines 2704 within the interlayer dielectric 2702. In this regard, a patterned photoresist (not shown) may be formed over the interlayer dielectric 2702.

The patterned photoresist may then be used to etch unmasked portions of the interlayer dielectric 2702 to form line cavities in the interlayer dielectric 2702. The patterned photoresist may then be removed by ashing or by dissolution with a solvent.

The electrically conductive lines 2704 may then be formed by depositing a conductive material in the line cavities formed in the interlayer dielectric 2702. The conductive material may include a metallic liner material and a metallic fill material. The metallic liner material may include a conductive metallic nitride or a conductive metallic carbide such as TiN, TaN, WN, TiC, TaC, and/or WC. The metallic fill material may include W, Cu, Al, Co, Ru, Mo, Ta, Ti, alloys thereof, and/or combinations thereof. Other suitable conductive materials within the contemplated scope of this disclosure may also be used. In some example embodiments, a thin layer of SiC 2706 may also be formed above the intermediate structure 2600 of FIG. 26 and below the interlayer dielectric 2702.

Figure 28:
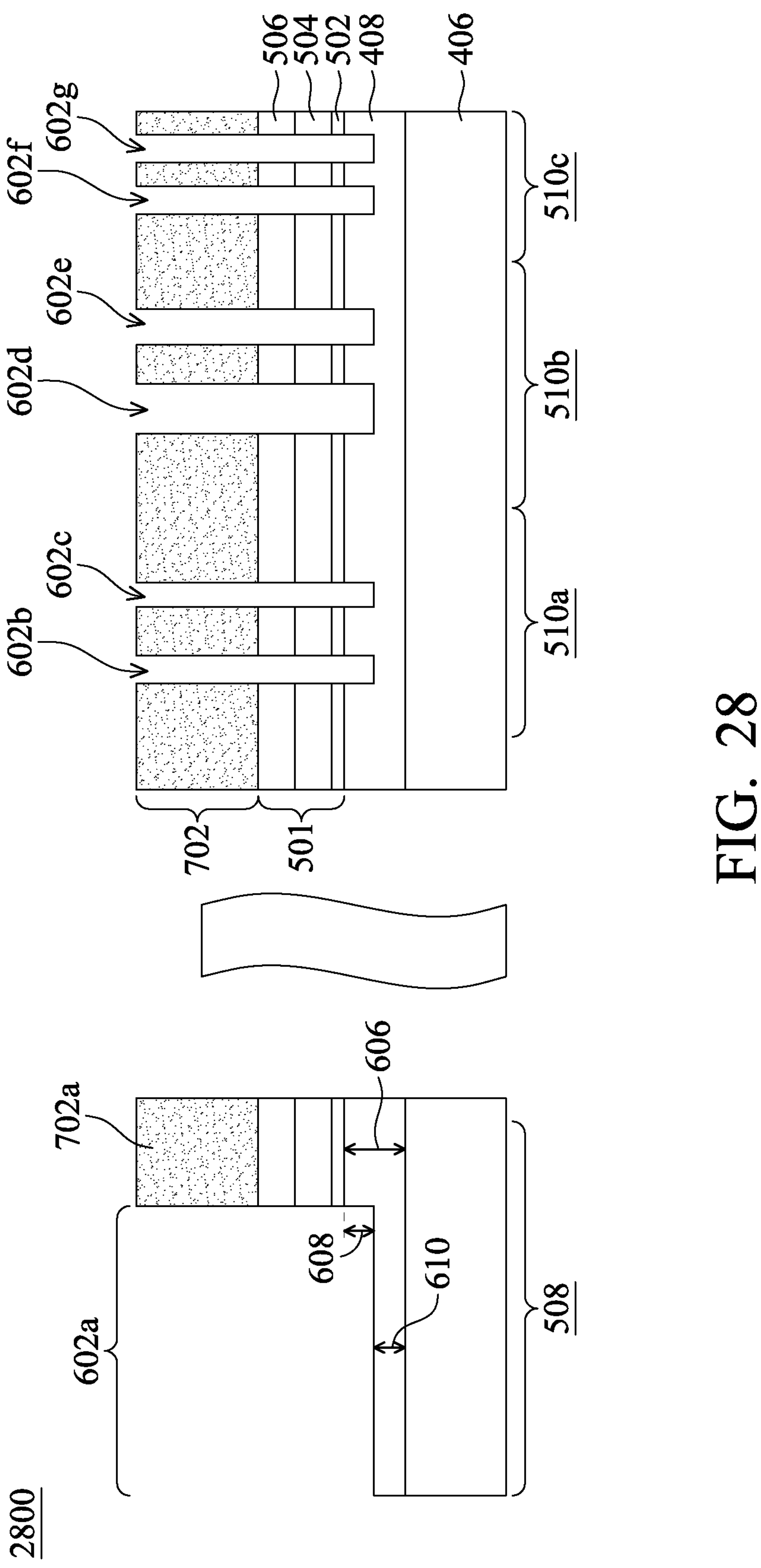
FIG. 28 is a vertical cross-sectional view of a further intermediate structure that may be used to form one or more photonic devices, according to various embodiments.
Figure 29:
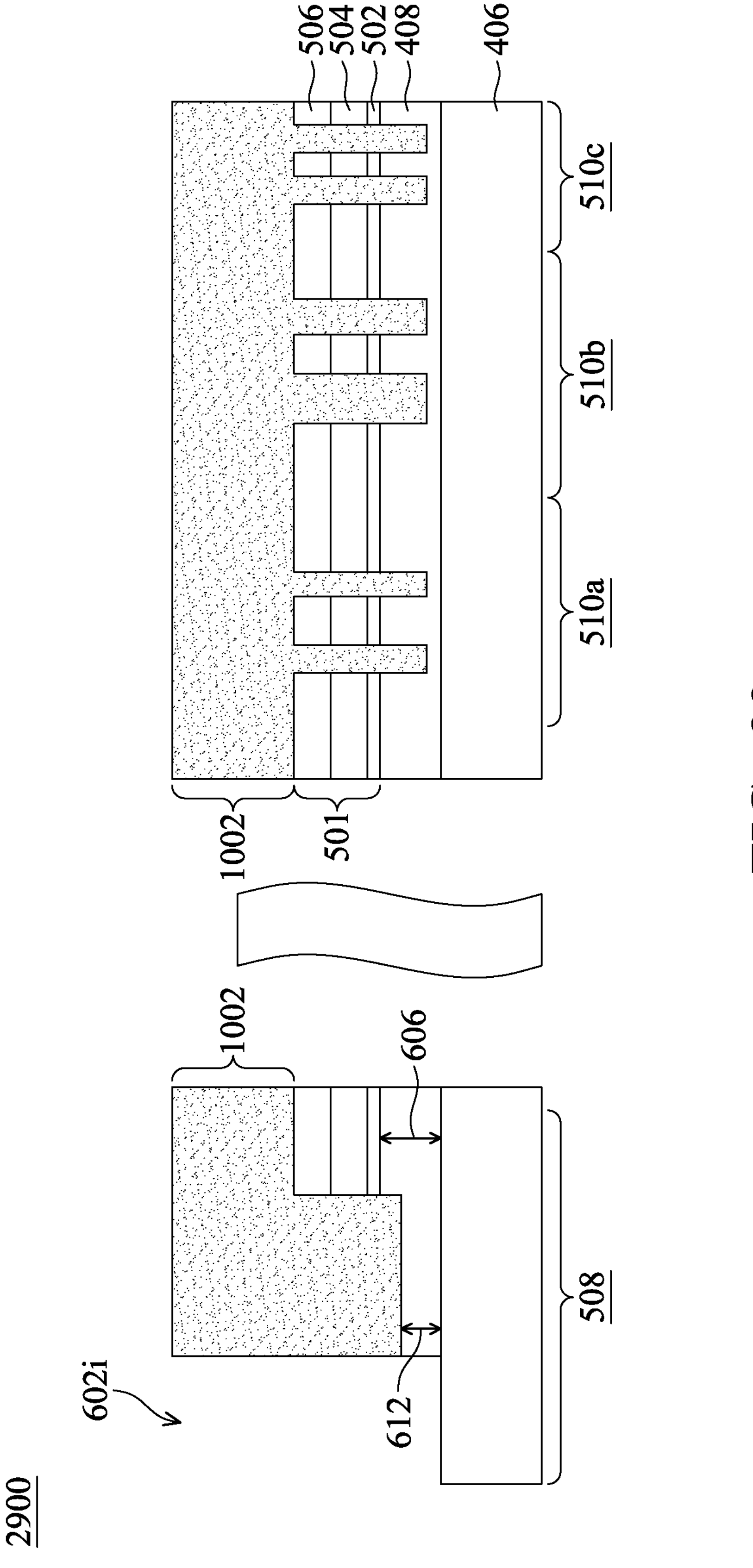
FIG. 29 is a vertical cross-sectional view of a further intermediate structure that may be used to form one or more photonic devices, according to various embodiments.
Figure 30:
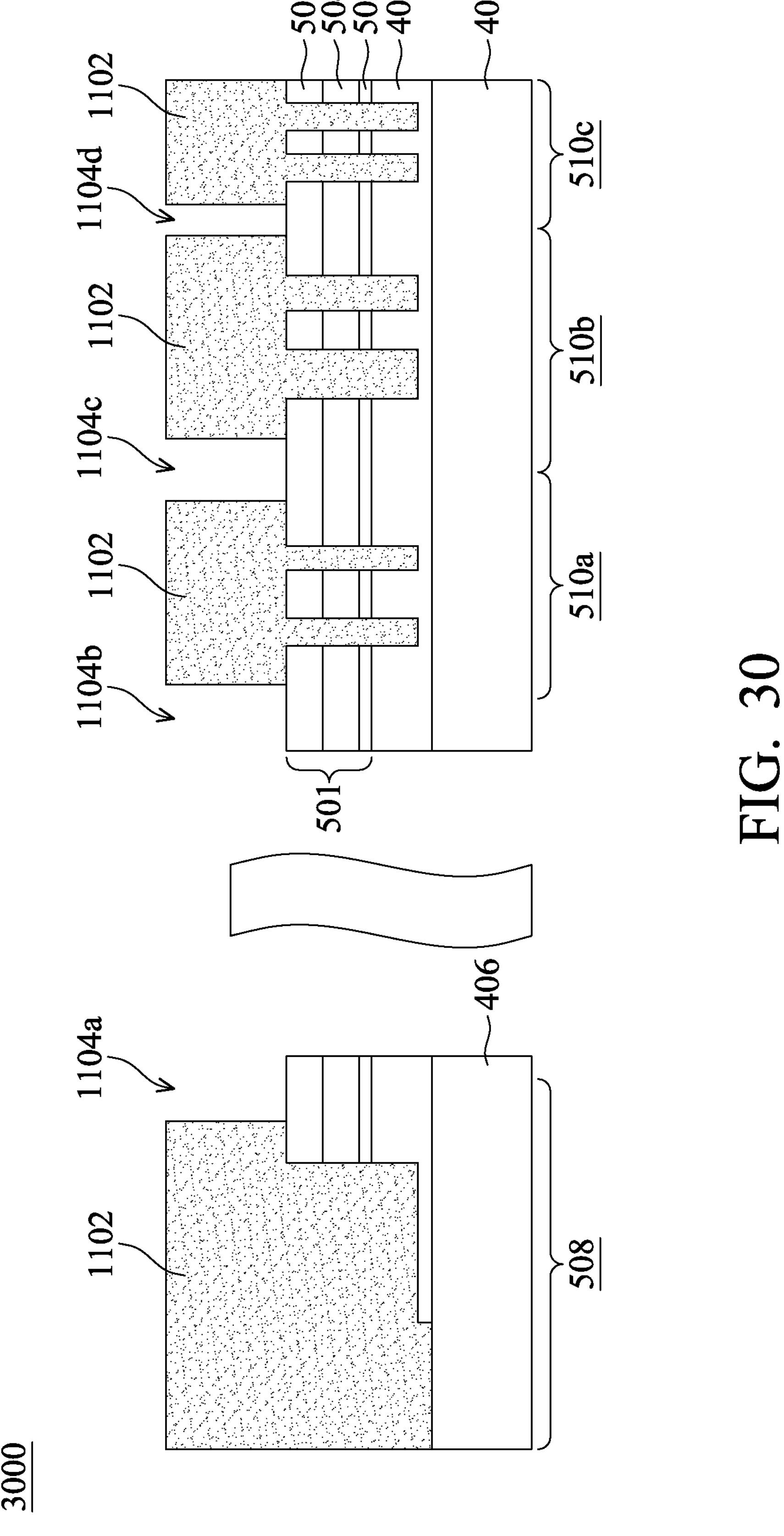
FIG. 30 is a vertical cross-sectional view of a further intermediate structure that may be used to form one or more photonic devices, according to various embodiments.
Figure 31:
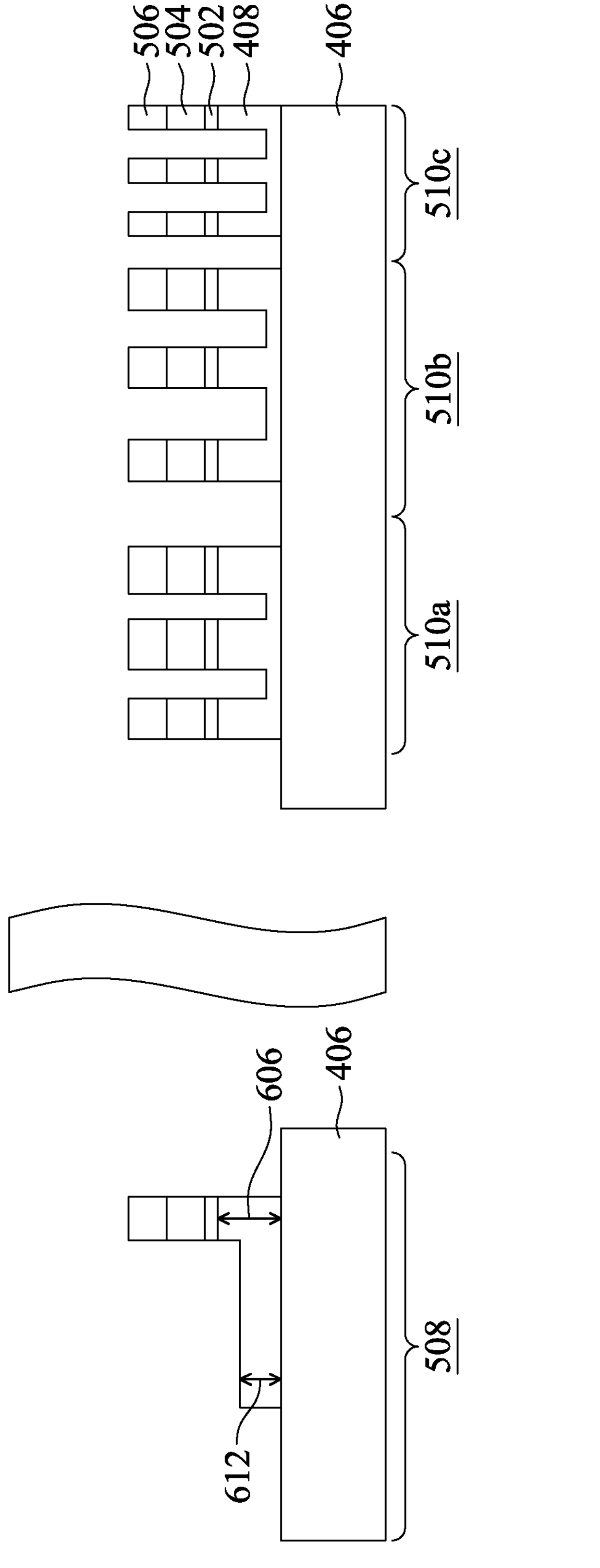
FIG. 31 is a vertical cross-sectional view of a further intermediate structure that may be used to form one or more photonic devices, according to various embodiments.

FIGS. 28 to 30 are vertical cross-sectional views of intermediate structures 2800, 2900, 3000, and 3100, respectively, which may be used to form one or more photonic devices, according to various embodiments. FIGS. 28 to 30 correspond to FIGS. 7, 10, 11, and 12 and may be used in an alternative process to generate the second SISCAP modulator 300*b* of FIG. 3B. In this regard, an alternative process may be performed following processes described above with reference to FIGS. 4 to 6. Then a process similar to that described above with reference to FIG. 7 may be performed to generate the intermediate structure 2800 of FIG. 28. Processes corresponding to those described above with reference to FIGS. 8 and 9 may then be omitted in the alternative process. Processes corresponding to those described above with reference to FIGS. 10 to 12 may then be performed leading to the intermediate structures 2900, 3000, and 3100 of FIGS. 29 to 31. The remaining processes described above with reference to FIGS. 13 to 27 may then be performed to generate the second SISCAP modulator 300*b* described above with reference to FIG. 3B. In an example embodiment, the thickness 606 and 612, shown in FIG. 31, may have values of approximately 270 nm and 130 nm, respectively. These thickness values are provided merely as examples and various other thicknesses may be used in other embodiments.

Figure 32:
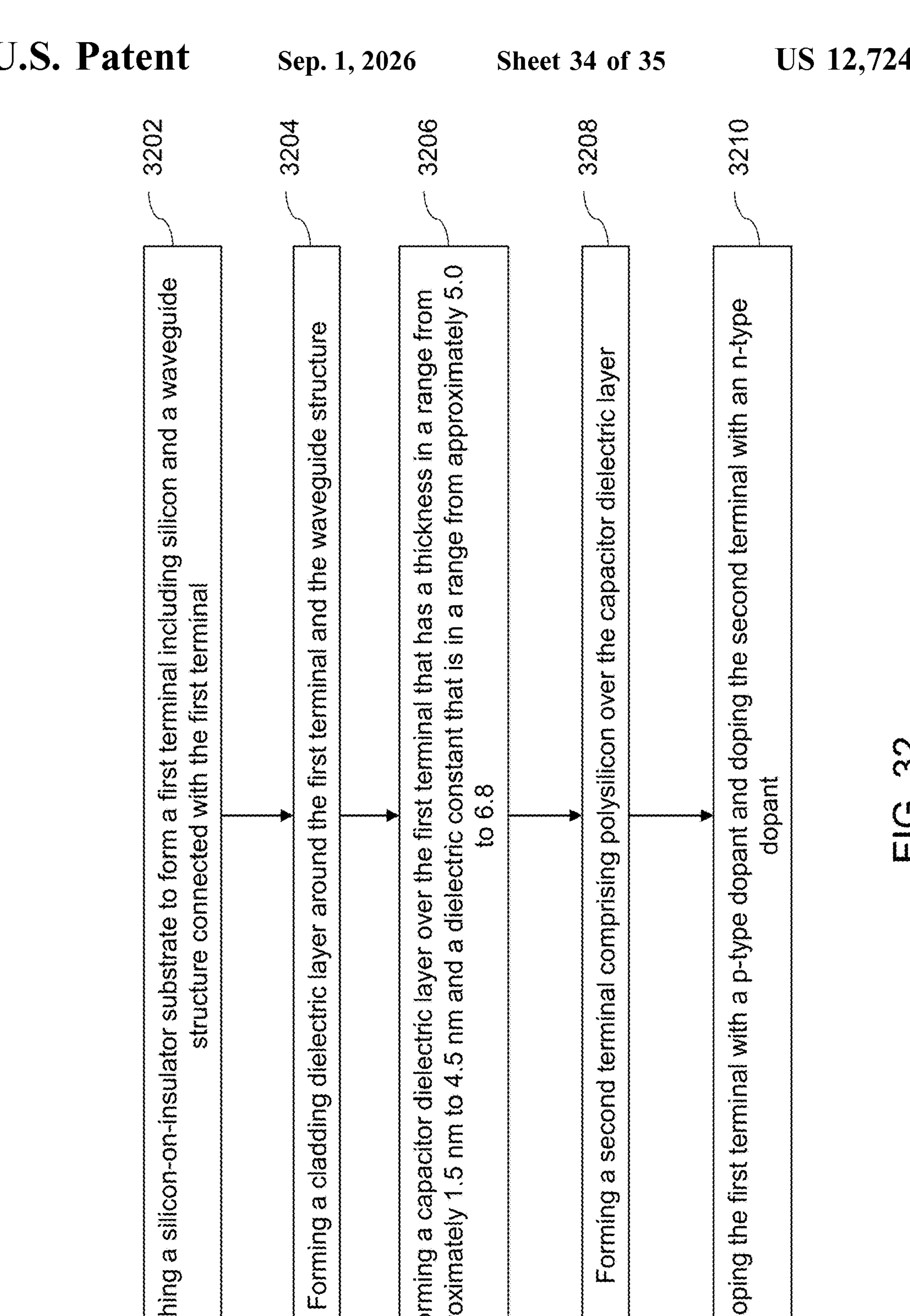
FIG. 32 is a flowchart illustrating operations of a method of forming a photonic modulator, according to various embodiments.

FIG. 32 is a flowchart illustrating operations of a method 3200 of fabricating photonic device (e.g., modulator/waveguide 300*b* of FIG. 3B or modulator/waveguide 300*c* of FIG. 3C). In operation 3202, the method 3200 may include etching a silicon-on-insulator substrate (e.g., see FIGS. 4 to 22) to form a first terminal including silicon and a waveguide structure 308 connected with the first terminal (e.g., first semiconductor structure 302*a*; see FIG. 22). In operation 3204, the method 3200 may include forming a cladding dielectric layer 1302 around the first terminal and the waveguide structure 308 (e.g., see FIG. 13). In operation 3206, the method 3200 may include forming a capacitor dielectric layer 1902 over the first terminal (e.g., see FIGS. 19B to 19E) that has a thickness in a range from approximately 1.5 nm to 4.5 nm and a dielectric constant that is in a range from approximately 5.0 to 6.8. In operation 3208, the method 3200 may include forming a second terminal including polysilicon over the capacitor dielectric layer (e.g., second semiconductor structure 302*b*; see FIG. 22). In operation 3210, the method 3200 may include doping the first terminal with a p-type dopant (e.g., see FIG. 23) and doping the second terminal with an n-type dopant (e.g., see FIG. 23).

According to the method 3200, forming the capacitor dielectric layer 1902 in operation 3206 may further include performing operations including performing an in-situ stream generation oxidation process or a rapid thermal oxidation process (e.g., see FIG. 19C) on the top silicon layer 408 of the first terminal to generate a gate oxide layer 1906 over the first terminal, performing a decoupled plasma nitridation process (e.g., see FIG. 19D) to introduce nitrogen into the gate oxide layer to generate a SiON layer 1908, and performing a post nitridation anneal process (e.g., see FIG. 19E) to anneal the SiON layer 1908 such that the capacitor dielectric layer 1902 includes an annealed SiON layer.

According to the method 3200, forming the second terminal including polysilicon in operation 3208 may further include forming a polysilicon layer 1904 over the capacitor dielectric layer 1902, and etching the polysilicon layer 1904 and the capacitor dielectric layer 1902 to form the second terminal 302*b* including the polysilicon and an insulator including a portion of the capacitor dielectric layer 1902 disposed between the first terminal and the second terminal (e.g., second semiconductor structure 302*b*; see FIG. 22). The method 3200 may further include forming the first terminal 302*a*, the second terminal 302*b*, and the insulator 304 such that the first terminal 302*a* has a thickness that is in a range from approximately 125 nm to approximately 180 nm, the second terminal 302*b* has a thickness that is in a range from approximately 85 nm to approximately 140 nm, and the insulator 304 has a thickness that is in a range from approximately 1.5 nm to 4.5 nm.

Figure 33:
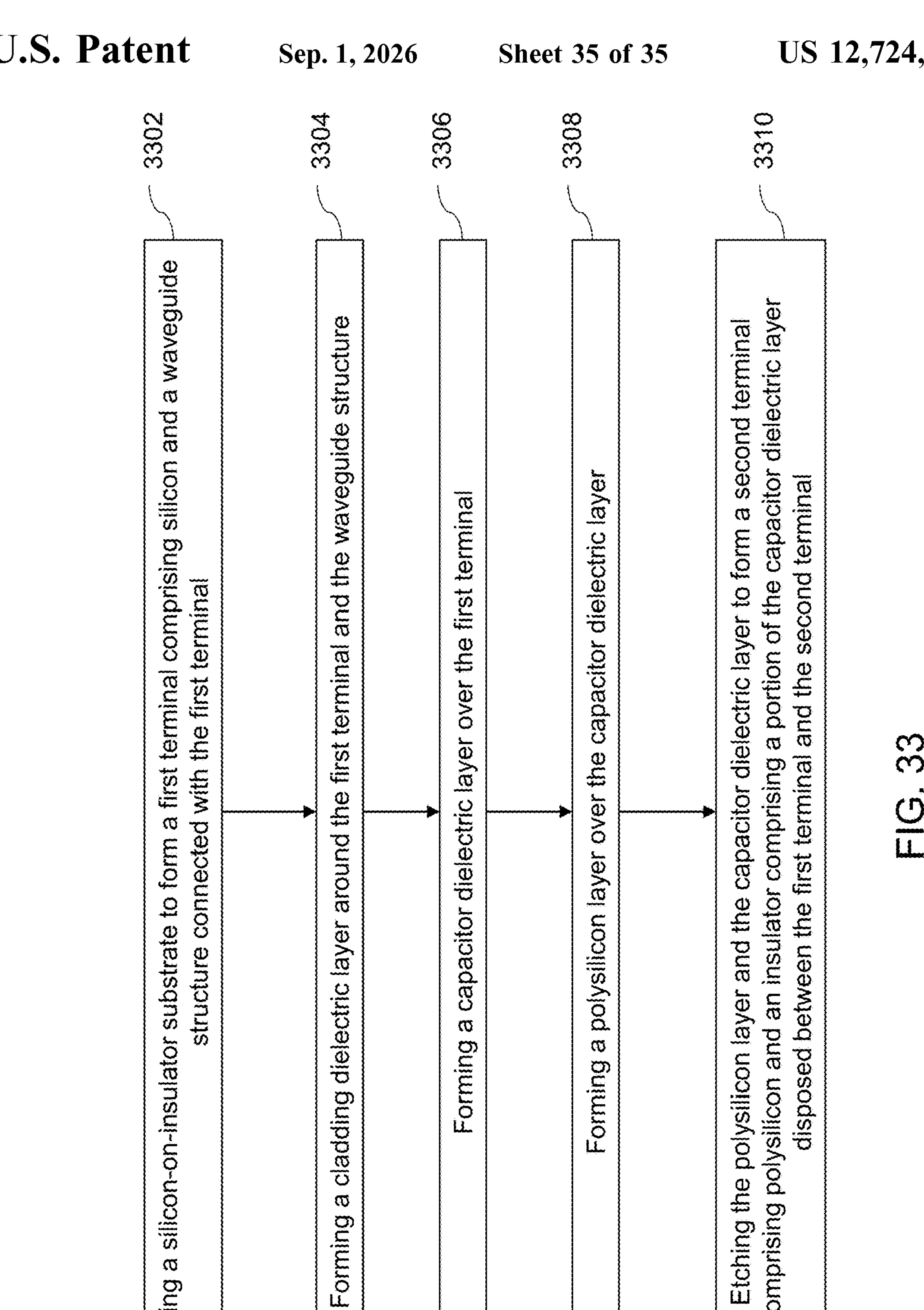
FIG. 33 is a flowchart illustrating operations of a further method of forming a photonic modulator, according to various embodiments.

FIG. 33 is a flowchart illustrating operations of a method 3300 of fabricating photonic device (e.g., modulator/waveguide 300*b* of FIG. 3B or modulator/waveguide 300*c* of FIG. 3C). In operation 3302, the method 3300 may include etching a silicon-on-insulator substrate (e.g., see FIGS. 4 to 22) to form a first terminal 302*a* including silicon and a waveguide structure 308 connected with the first terminal 302*a* (e.g., first semiconductor structure 302*a*; see FIG. 22). In operation 3304, the method 3300 may include forming a cladding dielectric layer 1302 around the first terminal and the waveguide structure 308 (e.g., see FIG. 13). In operation 3306, the method 3300 may include forming a capacitor dielectric layer 1902 over the first terminal (e.g., see FIGS. 19B to 19E). In operation 3308, the method 3300 may include forming a polysilicon layer 1904 over the capacitor dielectric layer 1902, and in operation 3310, the method 3300 may include etching the polysilicon layer 1904 and the capacitor dielectric layer 1902 to form a second terminal (e.g., second semiconductor structure 302*b*; see FIG. 22) including polysilicon 1904 and an insulator 304 including a portion of the capacitor dielectric layer 1902 disposed between the first terminal 302*a* and the second terminal 302*b*.

The method 3300 may further include doping the first terminal 302*a* with a p-type dopant (e.g., see FIG. 23) and doping the second terminal 302*b* with an n-type dopant (e.g., see FIG. 23) such that the first terminal 302*a*, the second terminal 302*b*, and the insulator 304 form a semiconductor-insulator-semiconductor capacitor. The method 3300 may further include forming the first terminal 302*a*, the second terminal 302*b*, and the insulator 304 to include a length along an optical propagation direction that is in a range from approximately 150 microns to approximately 300 microns. According to the method 3300, forming the capacitor dielectric layer 1902 in operation 3306 may further include forming a SiON layer 1908 having a dielectric constant that is in a range from approximately 5.0 to 6.8.

The method 3300 may further include forming an oxide layer 2602 over the semiconductor-insulator-semiconductor capacitor (e.g., see FIG. 26), etching the oxide layer 2602 to form via cavities (not shown) respectively over the first terminal 302*a* and the second terminal 302*b*, and filling the via cavities with an electrically conducting material to thereby form a first electrically conducting via 2604 and a second conducting via 2604 respectively electrically coupled to the first terminal 302*a* and the second terminal 302*b*. The method 3300 may further include forming an electrical interconnect structure including a first electrically conducting line 2704 electrically coupled to the first electrically conducting via 2604 and a second electrically conducting line 2704 electrically coupled to the second electrically conducting via 2600.

Referring to all drawings and according to various embodiments of the present disclosure, a photonic device (e.g., modulator/waveguide 300*b* or 300*c*) is provided. The photonic device (300*b*, 300*c*) may include a first terminal 302*a* including silicon and a waveguide structure 308 optically connected with the first terminal 302*a*, a cladding dielectric layer 1302 formed around the first terminal including the waveguide structure 308, a second terminal 302*b* including polysilicon 1904, and a capacitor dielectric layer 1902 disposed between the first terminal 302*a* and the second terminal 302*b*. In various embodiments, the capacitor dielectric layer 1902 may include a SiON layer 1902. The waveguide structure 308 may include a first index of refraction in response to an application of a first voltage difference between the first terminal 302*a* and the second terminal 302*b*, and the waveguide structure 30 may include a second index of refraction in response to an application of a second voltage difference between the first terminal 302*a* and the second terminal 302*b*. The silicon of the first terminal 302*a* may include a p-typed doping (e.g., see FIG. 23, and the polysilicon 1904 of the second terminal 302*b* may include an n-type doping (e.g., see FIG. 23).

Each of the first terminal 302*a*, the second terminal 302*b*, and the capacitor dielectric layer 1902 may include a length along an optical propagation direction that is in a range from approximately 150 microns to approximately 300 microns. The first terminal 302*a* may include a thickness in a range from approximately 125 nm to approximately 180 nm, and the second terminal 302*b* may include a thickness in a range from approximately 85 nm to approximately 140 nm. The first terminal 302*a* may have a thickness that is approximately 130 nm or 175 nm, and the second terminal 302*b* may have a thickness that is approximately 90 nm or 135 nm. The capacitor dielectric layer 1902 may have a thickness that is in a range from approximately 1.5 nm to 4.5 nm. For example, the capacitor dielectric layer 1902 may have a thickness that is approximately 2.0 nm.

The first terminal 302*a*, the second terminal 302, and the capacitor dielectric layer 1902 may have a width that is in a range from approximately 0.4 microns to approximately 0.6 microns. For example, the first terminal 302*a*, the second terminal 302*b*, and the capacitor dielectric layer 1902 may have a width that is approximately 0.5 microns. In various embodiments, the first terminal 302*a*, the second terminal 302*b*, and the capacitor dielectric layer 1902 may form a semiconductor-insulator-semiconductor capacitor (e.g., see FIG. 26) including a capacitance per unit area that is in a range from approximately 10 fF/micron2 to approximately 12 fF/micron2 and including an optical insertion loss of less than 0.18 dB/cm.

Disclosed embodiments may provide advantages over existing modulators by generating larger optical phase shifts for a given applied voltage and by having reduced optical insertion loss relative to existing modulators.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure

What is claimed is:

1. A method of fabricating a photonic device, comprising:

etching a silicon-on-insulator substrate to form a first terminal comprising silicon and a waveguide structure connected with the first terminal;

forming a cladding dielectric layer around the first terminal and the waveguide structure;

forming a capacitor dielectric layer over the first terminal, wherein forming the capacitor dielectric layer comprises:

forming a gate oxide layer over the first terminal, wherein forming the gate oxide layer consumes the silicon of the first terminal;

forming a SiON layer by introducing nitrogen into the gate oxide layer; and annealing the SiON layer such that the capacitor dielectric layer comprises the annealed SiON layer having a thickness in a range from approximately 1.5 nm to 4.5 nm and a dielectric constant that is in a range from approximately 5.0 to 6.8;

forming a second terminal comprising polysilicon over the capacitor dielectric layer; and doping the first terminal with a p-type dopant and doping the second terminal with an n-type dopant.

2. The method of claim 1, wherein:

forming the gate oxide layer includes performing an in-situ steam generation oxidation process or a rapid thermal oxidation process on the silicon of the first terminal;

introducing the nitrogen into the gate oxide layer includes performing a decoupled plasma nitridation process; and the annealing the SiON layer includes performing a post nitridation anneal process.

3. The method of claim 1, wherein forming the second terminal further comprises:

forming a polysilicon layer over the capacitor dielectric layer; and etching the polysilicon layer and the capacitor dielectric layer to form the second terminal comprising the polysilicon and an insulator comprising a portion of the capacitor dielectric layer disposed between the first terminal and the second terminal.

4. The method of claim 3, further comprising forming the first terminal, the second terminal, and the insulator such that:

the first terminal comprises a thickness that is in a range from approximately 125 nm to approximately 180 nm;

the second terminal comprises a thickness that is in a range from approximately 85 nm to approximately 140 nm; and the insulator comprises a thickness that is in a range from approximately 1.5 nm to 4.5 nm.

5. A method of fabricating a photonic device, comprising:

etching a silicon-on-insulator substrate to form a first terminal comprising silicon and a waveguide structure connected with the first terminal;

forming a cladding dielectric layer around the first terminal and the waveguide structure;

forming a capacitor dielectric layer over the first terminal, wherein forming the capacitor dielectric layer comprises:

forming a gate oxide layer over the first terminal, wherein forming the gate oxide layer consumes the silicon of the first terminal;

forming a SiON layer by introducing nitrogen into the gate oxide layer; and annealing the SiON layer;

forming a polysilicon layer over the capacitor dielectric layer; and etching the polysilicon layer and the capacitor dielectric layer to form a second terminal comprising polysilicon and an insulator comprising a portion of the capacitor dielectric layer disposed between the first terminal and the second terminal.

6. The method of claim 5, further comprising:

doping the first terminal with a p-type dopant and doping the second terminal with an n-type dopant such that the first terminal, the second terminal, and the insulator form a semiconductor-insulator-semiconductor capacitor; and forming the first terminal, the second terminal, and the insulator to comprise a length along an optical propagation direction that is in a range from approximately 150 microns to approximately 300 microns.

7. The method of claim 5, wherein forming the capacitor dielectric layer further comprises forming a SiON layer having a dielectric constant that is in a range from approximately 5.0 to 6.8.

8. The method of claim 6, further comprising:

forming an oxide layer over the semiconductor-insulator-semiconductor capacitor;

etching the oxide layer to form via cavities respectively over the first terminal and the second terminal; and filling the via cavities with an electrically conducting material to thereby form a first electrically conducting via and a second conducting via respectively electrically coupled to the first terminal and the second terminal.

9. The method of claim 5, further comprising forming an electrical interconnect structure comprising a first electrically conducting line electrically coupled to the first electrically conducting via and a second electrically conducting line electrically coupled to the second electrically conducting via.

10. A method of fabricating a photonic device, comprising:

providing a silicon-on-insulator substrate;

forming a core comprising:

etching the silicon-on-insulator substrate to form a silicon portion of the core;

forming an oxide layer over the silicon portion of the core, wherein forming the oxide layer comprises:

forming a gate oxide layer over the first terminal, wherein forming the gate oxide layer consumes the silicon of the first terminal;

forming a SiON layer by introducing nitrogen into the gate oxide layer; and annealing the SiON layer; and forming a polysilicon portion of the core over the oxide layer;

forming a cladding dielectric layer around the core;

wherein the silicon portion extends to a first terminal and the polysilicon portion extends to a second terminal, wherein the oxide layer is disposed between the silicon portion and the polysilicon portion.

11. The method of claim 10, wherein the silicon-on-insulator substrate comprises a top silicon layer having a thickness of approximately 305 nm, a buried oxide layer having a thickness of approximately 2.5 microns, and a bulk silicon layer.

12. The method of claim 10, wherein the oxide layer includes a silicon oxynitride layer having a thickness in a range from approximately 1.5 nm to 4.5 nm.

13. The method of claim 10, wherein the oxide layer includes a dielectric constant in a range from approximately 5.0 to 6.8.

14. The method of claim 10, wherein forming the polysilicon portion comprises depositing a polysilicon layer having a thickness in a range from approximately 90 nm to 135 nm.

15. The method of claim 10, further comprising doping:

the first terminal with a first type dopant; and the second terminal with a second type dopant, wherein the first type dopant is different from the second type dopant.

16. The method of claim 15, wherein:

doping the first terminal includes masking the silicon portion of the core; and doping the second terminal includes masking the polysilicon portion of the core.

17. The method of claim 16, further comprising forming holes in a resistive protective oxide (RPO) wherein the RPO is disposed on the first terminal, the second terminal, the core after the doping.

18. The method of claim 17, wherein metal ions are deposited through the holes.

19. The method of claim 18, wherein self-aligned silicides are formed through the holes.

20. The method of claim 10, wherein the first terminal, the second terminal, and the oxide layer form a semiconductor-insulator-semiconductor capacitor having a length along an optical propagation direction in a range from 150 microns to 300 microns.

* * * * *